United States Patent
Matsumoto et al.

(10) Patent No.: US 9,348,135 B2
(45) Date of Patent: May 24, 2016

(54) MICRO MOVABLE DEVICE AND OPTICAL SWITCHING APPARATUS

(75) Inventors: Tsuyoshi Matsumoto, Kawasaki (JP); Norinao Kouma, Kawasaki (JP); Osamu Tsuboi, Kawasaki (JP)

(73) Assignee: DRNC Holdings, Inc., Wilmington, DE (US)

( * ) Notice: Subject to any disclaimer, the term of this patent is extended or adjusted under 35 U.S.C. 154(b) by 389 days.

(21) Appl. No.: 12/555,246

(22) Filed: Sep. 8, 2009

(65) Prior Publication Data

US 2010/0085623 A1    Apr. 8, 2010

(30) Foreign Application Priority Data

Oct. 8, 2008 (JP) ................. 2008-261653

(51) Int. Cl.
*G02B 26/08* (2006.01)

(52) U.S. Cl.
CPC ....... *G02B 26/0841* (2013.01); *B81B 2201/042* (2013.01)

(58) Field of Classification Search
CPC .............. B81C 1/002378; B81C 1/00357; B81C 1/00365; B81C 3/001; B81C 201/019
USPC .......... 359/196.1–226.3, 290–295, 838, 846, 359/871–872, 904; 250/204, 559.06, 250/559.29, 230, 234; 347/255–260; 353/39, 98–99; 385/15–18, 22; 398/12, 398/19, 45
See application file for complete search history.

(56) References Cited

U.S. PATENT DOCUMENTS

| | | | |
|---|---|---|---|
| 6,442,307 B1 * | 8/2002 | Carr et al. | 385/18 |
| 6,448,624 B1 | 9/2002 | Ishio et al. | |
| 6,590,710 B2 | 7/2003 | Hara et al. | |
| 6,906,849 B1 * | 6/2005 | Mi et al. | 359/291 |
| 2002/0054422 A1 * | 5/2002 | Carr et al. | 359/291 |
| 2003/0218793 A1 * | 11/2003 | Soneda et al. | 359/291 |
| 2005/0007933 A1 | 1/2005 | Yoda | |
| 2005/0063038 A1 * | 3/2005 | Filhol | 359/291 |
| 2006/0008200 A1 | 1/2006 | Nakamura et al. | |

(Continued)

FOREIGN PATENT DOCUMENTS

| | | |
|---|---|---|
| JP | 09-219351 | 8/1997 |
| JP | 10-123167 | 5/1998 |
| JP | 2003-19700 | 1/2003 |
| JP | 2003-19530 | 12/2003 |
| JP | 2003344785 A * | 12/2003 |

(Continued)

OTHER PUBLICATIONS

Machine translation of JP 2003-344785 A.*

*Primary Examiner* — Kimberly N Kakalec
(74) *Attorney, Agent, or Firm* — Baker & Hostetler LLP

(57) ABSTRACT

A micro movable device includes: a micro movable substrate including a micro movable unit, the micro movable unit including a frame section, a movable section, and a coupling section which couples the frame section and the movable section to each other; a support base; a first spacer and a second spacer which are provided between the frame section of the micro movable substrate and the base, the first and second spacers joining the frame section and the base to each other; and a fixation member provided between the frame section of the micro movable substrate and the base, the fixation member including a spacer portion which joins the frame section and the base to each other and an adhesive portion which covers the spacer portion and joins the frame section and the base to each other, the fixation member being provided between the first and second spacers.

19 Claims, 28 Drawing Sheets

(56) References Cited

U.S. PATENT DOCUMENTS

| | | | |
|---|---|---|---|
| 2006/0030074 A1* | 2/2006 | Mund et al. | 438/108 |
| 2008/0122117 A1* | 5/2008 | Pendse | 257/778 |
| 2009/0243006 A1* | 10/2009 | Takahashi et al. | 257/415 |
| 2010/0092130 A1 | 4/2010 | Soneda et al. | |

FOREIGN PATENT DOCUMENTS

| | | |
|---|---|---|
| JP | 2004-341364 | 12/2004 |
| JP | 2006-72252 | 3/2006 |
| JP | 2006-251829 | 9/2006 |
| JP | 2008-263658 | 10/2008 |

* cited by examiner

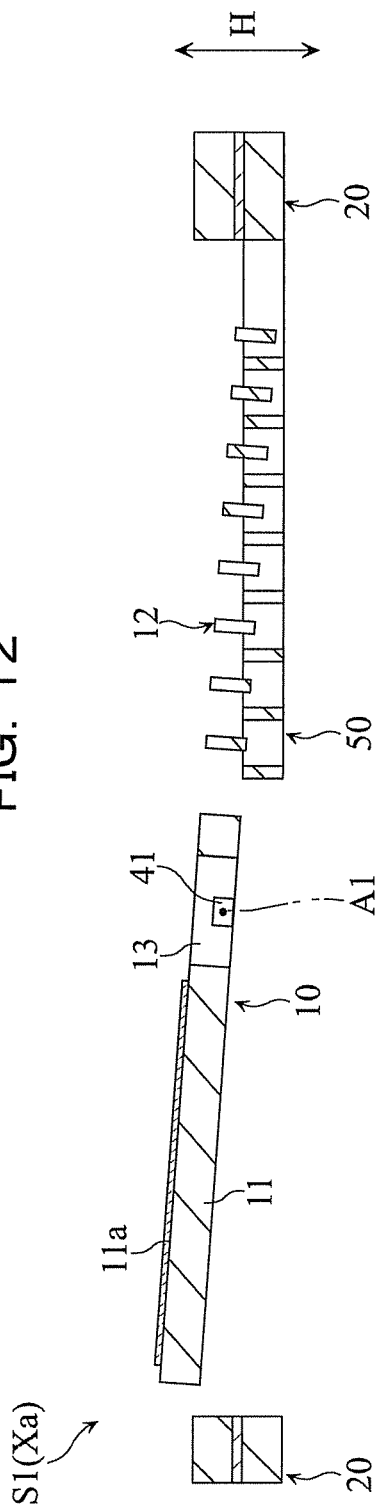

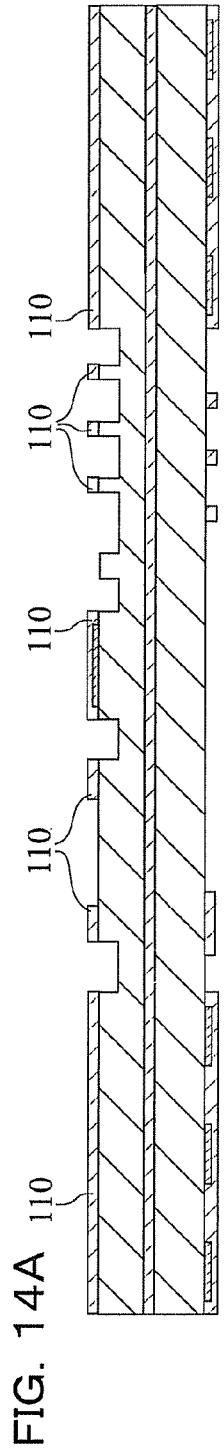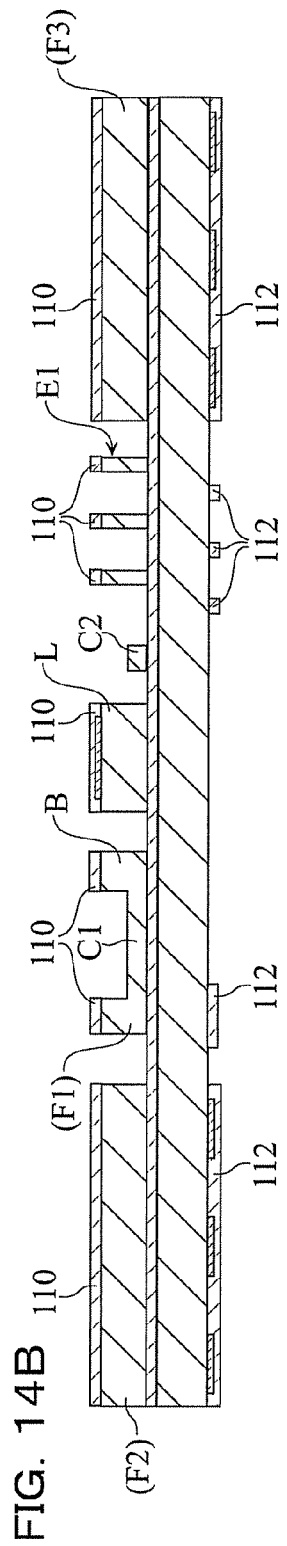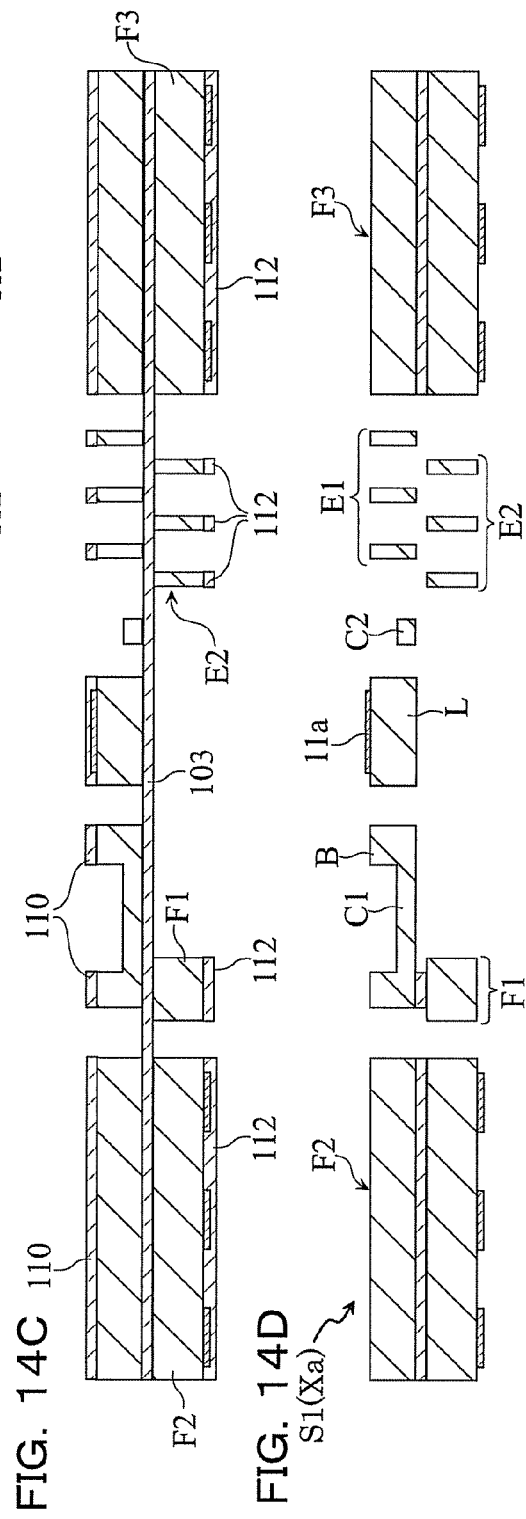

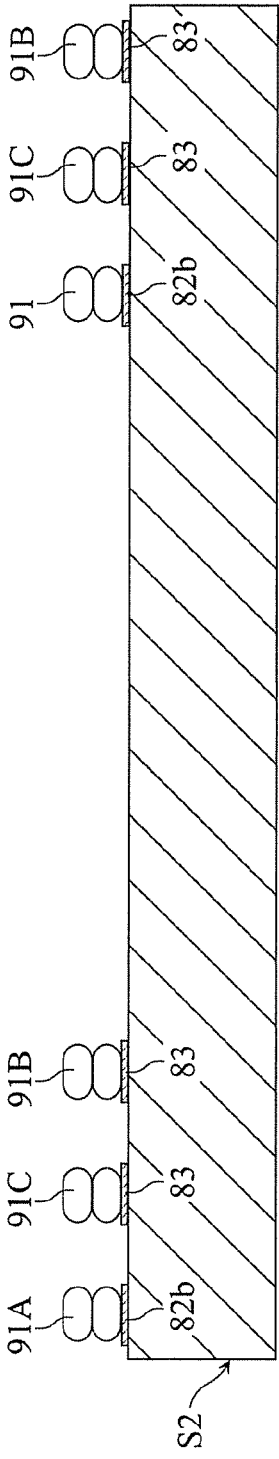
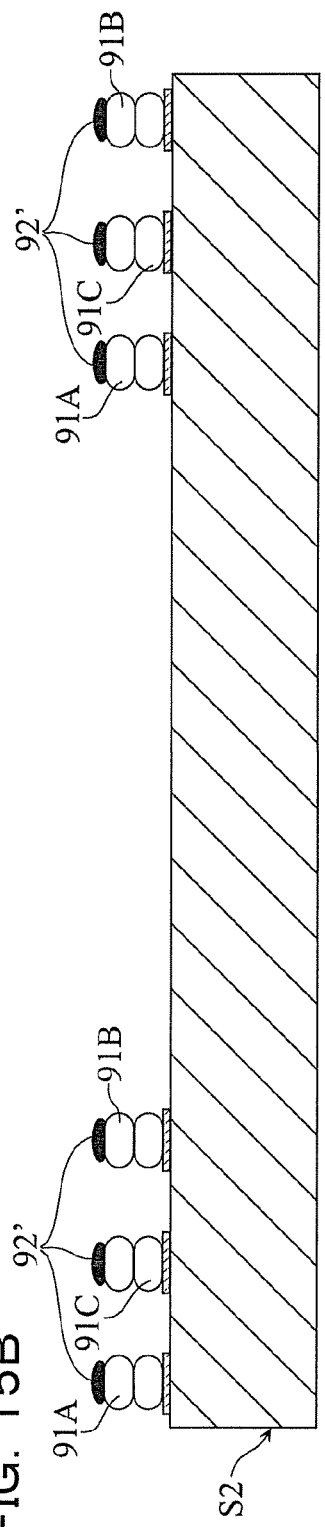
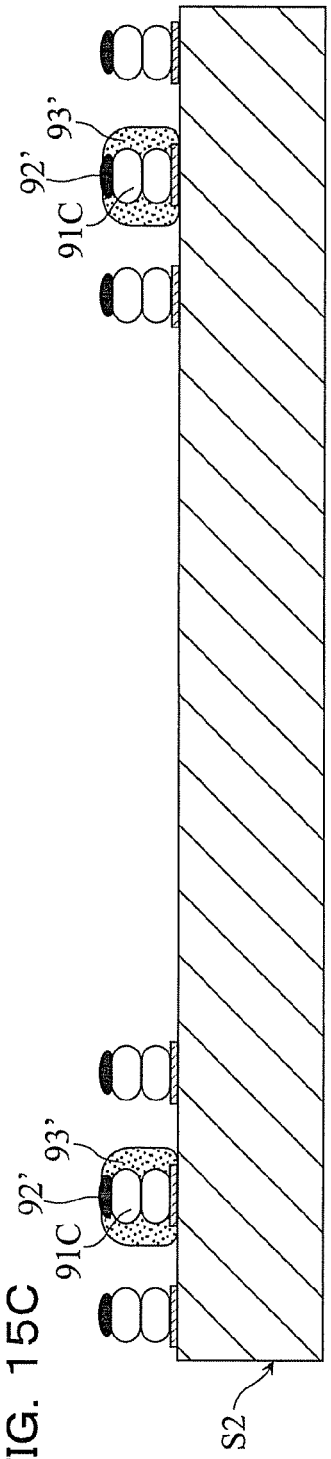

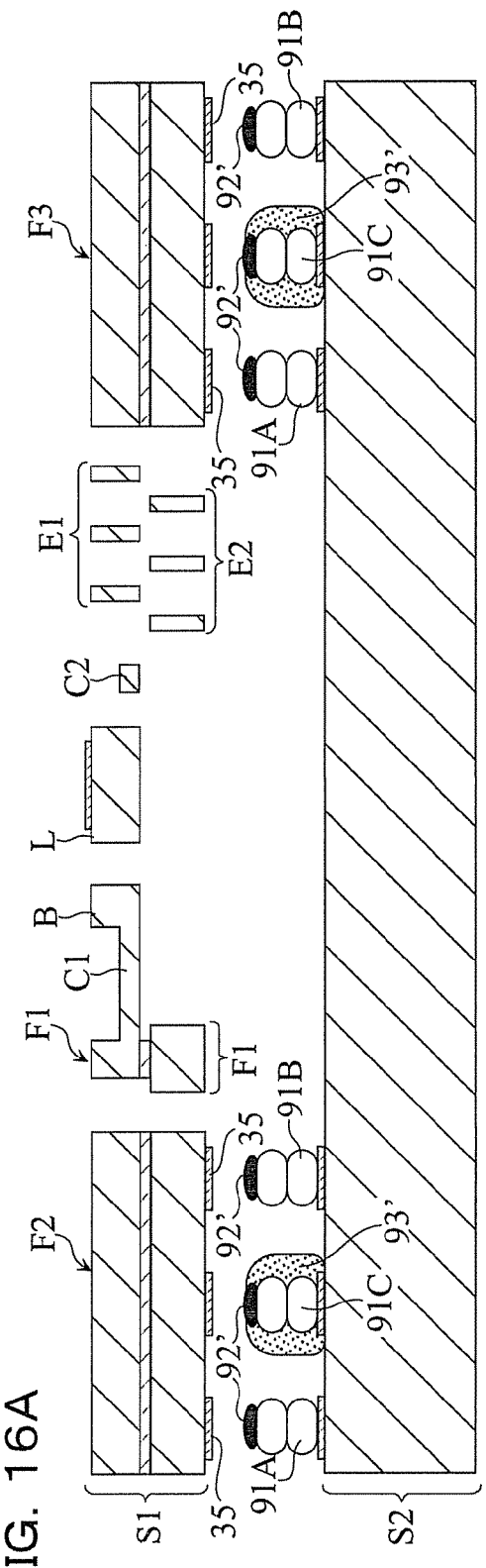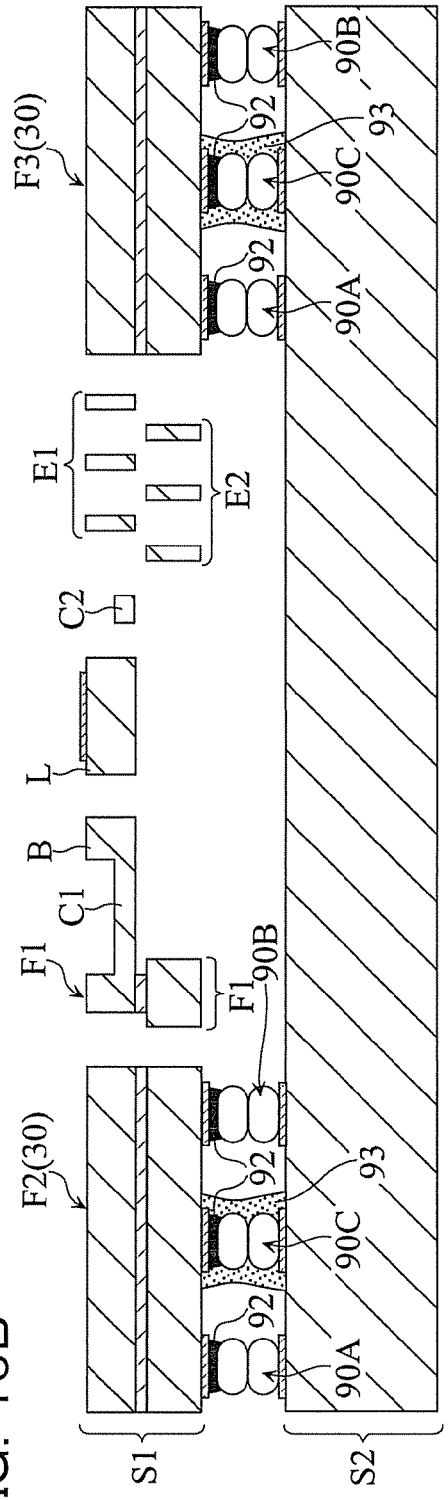

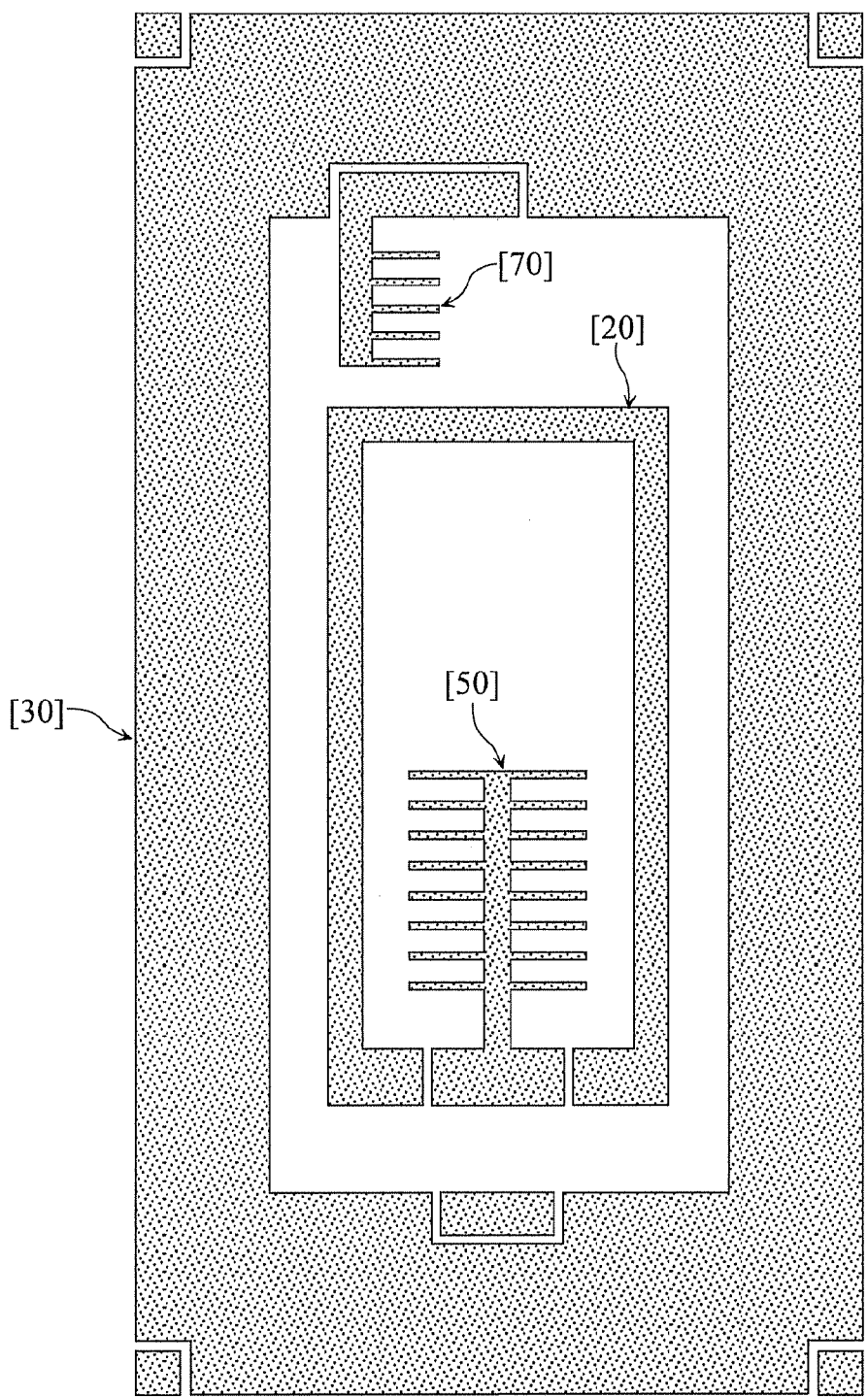

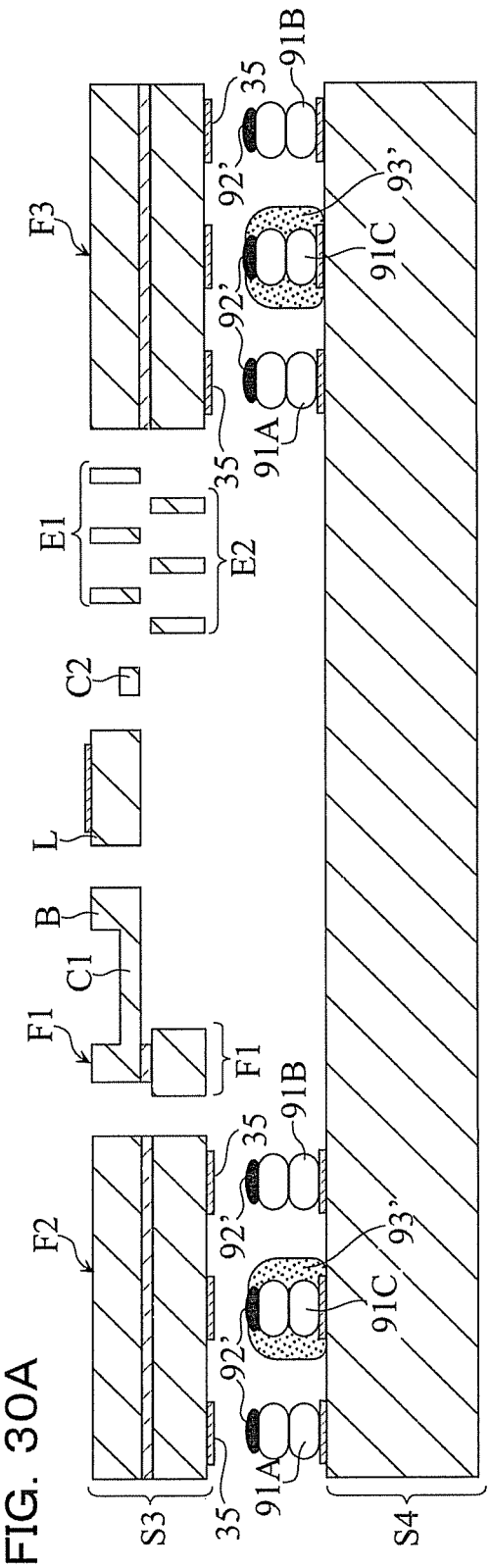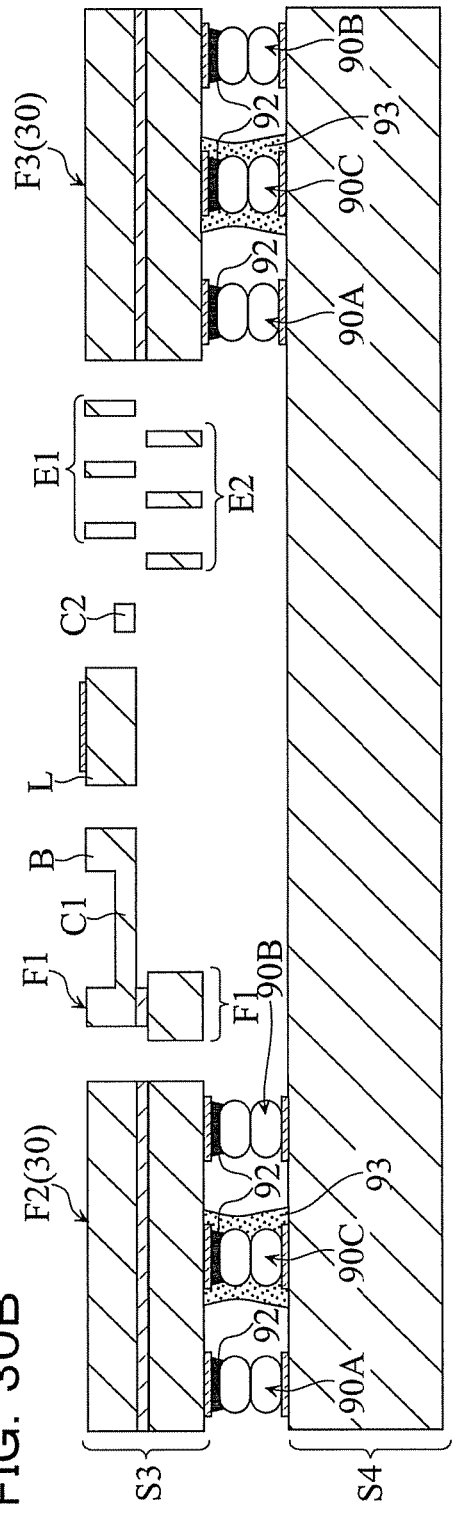

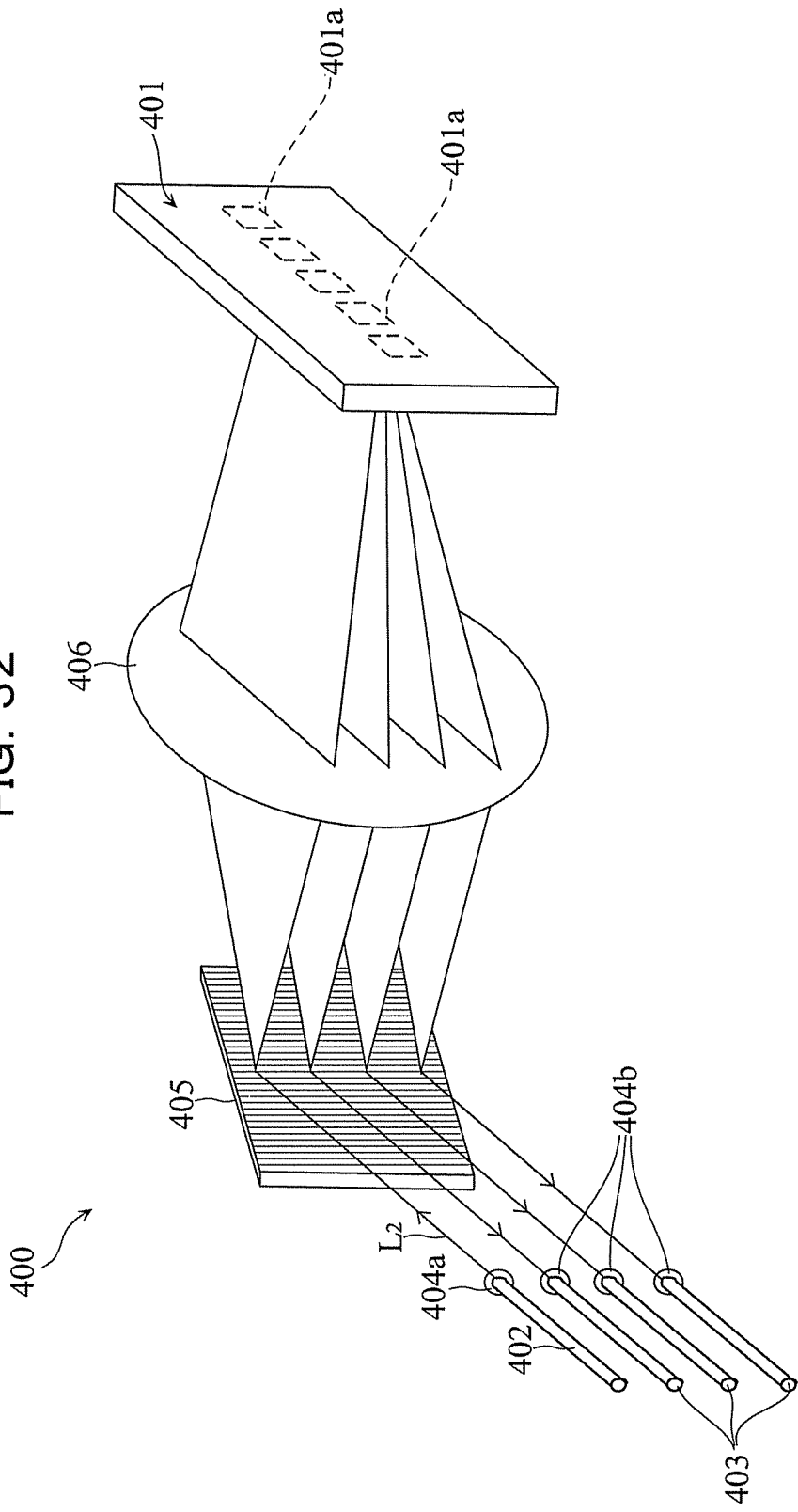

MICRO MOVABLE DEVICE AND OPTICAL SWITCHING APPARATUS

CROSS-REFERENCE TO RELATED APPLICATION

This application is based upon and claims the benefit of priority of the prior Japanese Patent Application No. 2008-261653, filed on Oct. 8, 2008, the entire contents of which are incorporated herein by reference.

FIELD

The embodiments discussed herein are related to a micro movable device including a small movable section, and to an optical switching apparatus including a micromirror device.

BACKGROUND

Recently, devices having a microstructure formed by micromachining techniques have been used in various fields. Examples of such devices include micro movable devices, such as a micromirror device, an angular velocity sensor, and an acceleration sensor, which include small movable sections. The micromirror device is used as, for example, an optical reflective device in the field of optical communication and optical disc technology. The angular velocity sensor and the acceleration sensor are used in, for example, a image stabilizing devices in video cameras or camera-equipped mobile phones, car navigation systems, airbag-deployment timing systems, or position control systems for vehicles or robots. Japanese Unexamined Patent Application Publications Nos. 2003-19700, 2004-341364, and 2006-72252 disclose examples of micro movable devices.

SUMMARY

According to an aspect of an invention, a micro movable device includes: a micro movable substrate including a micro movable unit, the micro movable unit including a frame section, a movable section, and a coupling section which couples the frame section and the movable section to each other; a support base; a first spacer and a second spacer which are provided between the frame section of the micro movable substrate and the support base, the first spacer and the second spacer joining the frame section and the support base to each other; and a fixation member provided between the frame section of the micro movable substrate and the support base, the fixation member including a spacer portion which joins the frame section and the support base to each other and an adhesive portion which covers the spacer portion and joins the frame section and the support base to each other, the fixation member being provided between the first spacer and the second spacer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a sectional view of FIG. 1 taken along line IV-IV in a driving state;

FIGS. 14A to 14D are diagrams illustrating manufacturing processing performed after the processing illustrated in FIGS. 13A to 13D;

FIGS. 15A to 15C are diagrams illustrating manufacturing processing of the micro movable device illustrated in FIG. 1;

FIGS. 16A and 16B are diagrams illustrating a manufacturing processing (substrate bonding processing) of the micro movable device illustrated in FIG. 1;

FIG. 18 is a plan view illustrating another mask pattern;

FIGS. 30A and 30B are diagrams illustrating a manufacturing processing of the micro movable device illustrated in FIG. 24;

FIG. 32 is a schematic diagram illustrating an optical switching apparatus according to a fourth embodiment.

DESCRIPTION OF EMBODIMENTS

Figure 1:
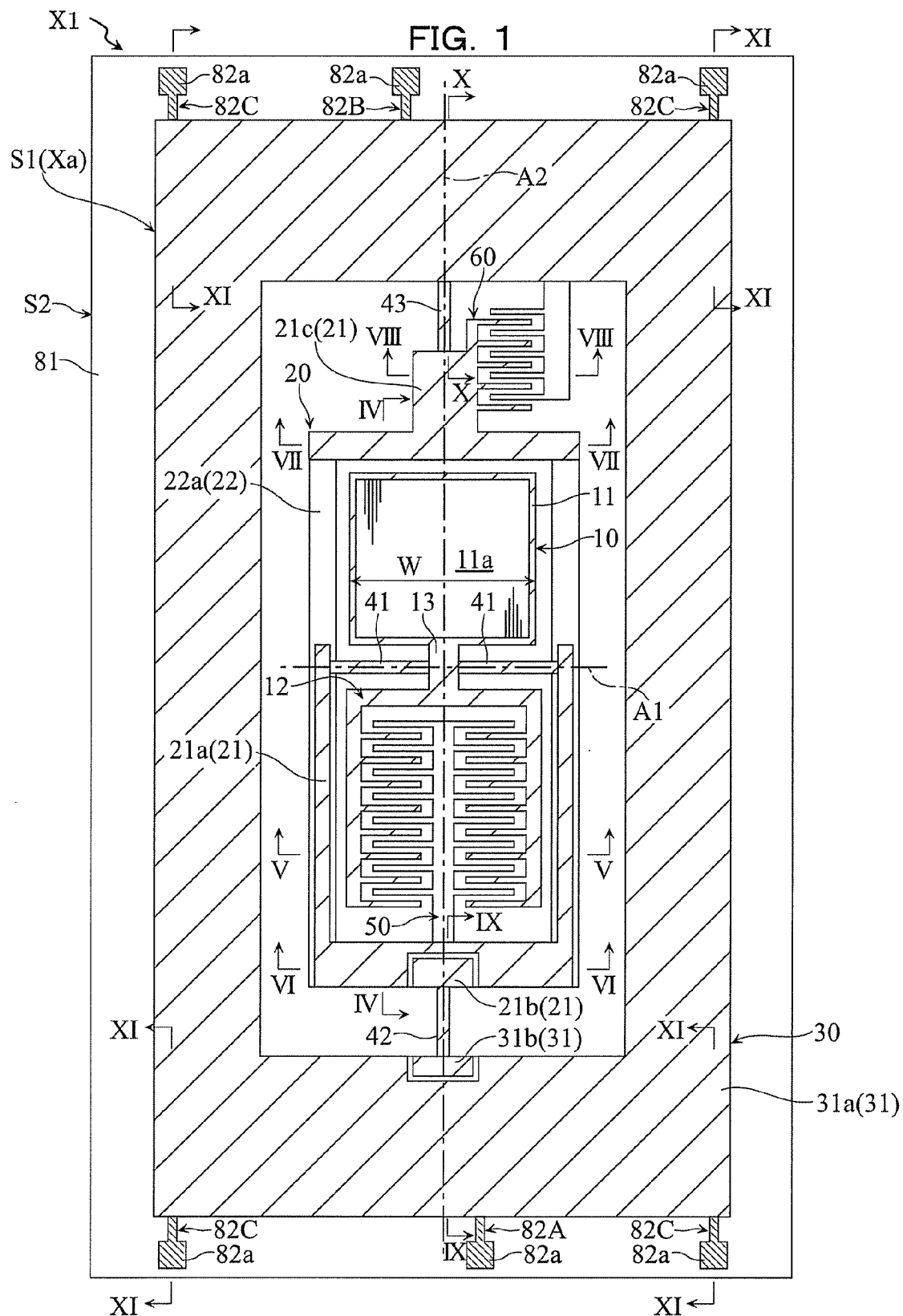
FIG. 1 is a plan view of a micro movable device according to a first embodiment.
Figure 2:
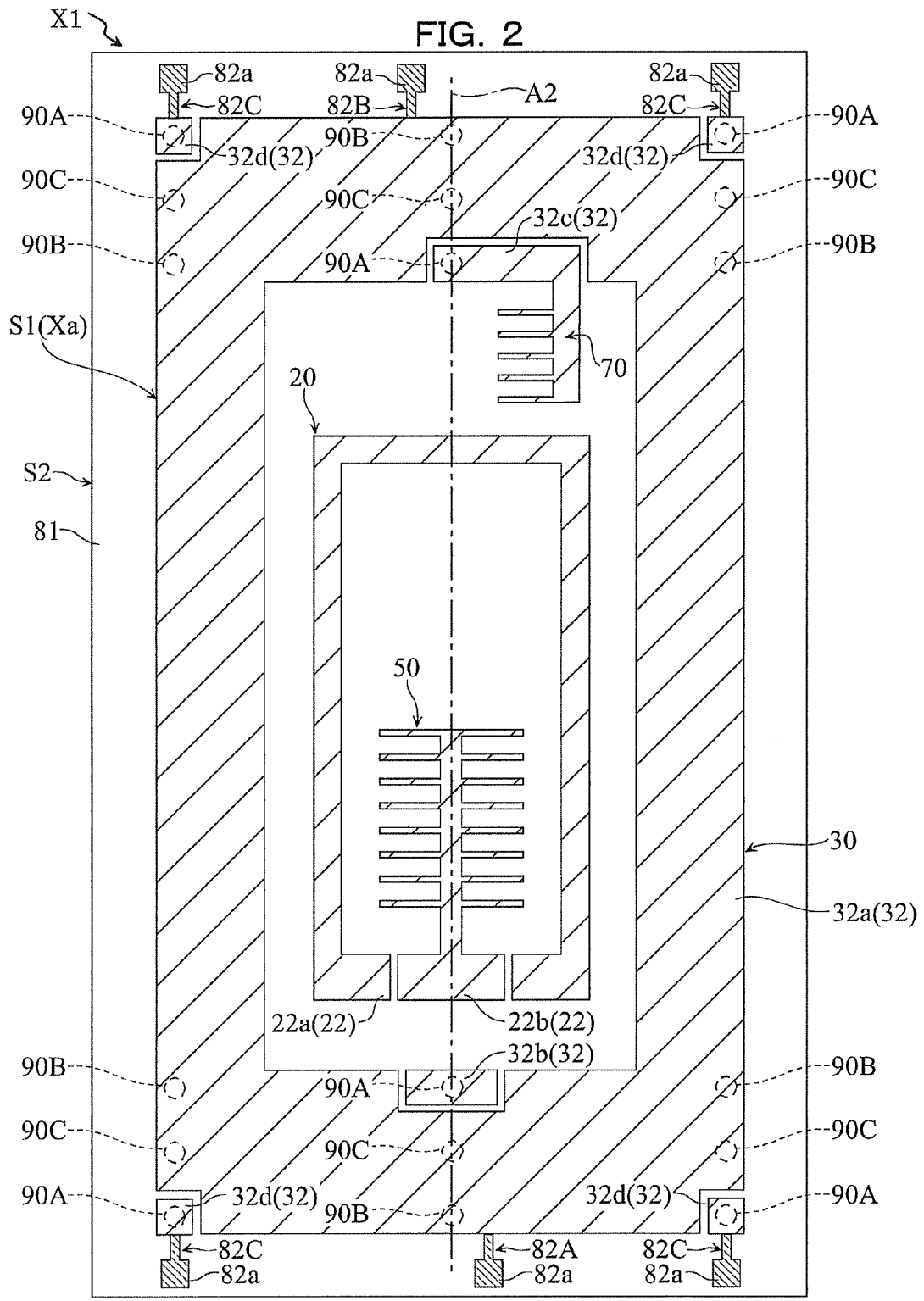
FIG. 2 is a plan view of a part of the micro movable device illustrated in FIG. 1.
Figure 3:
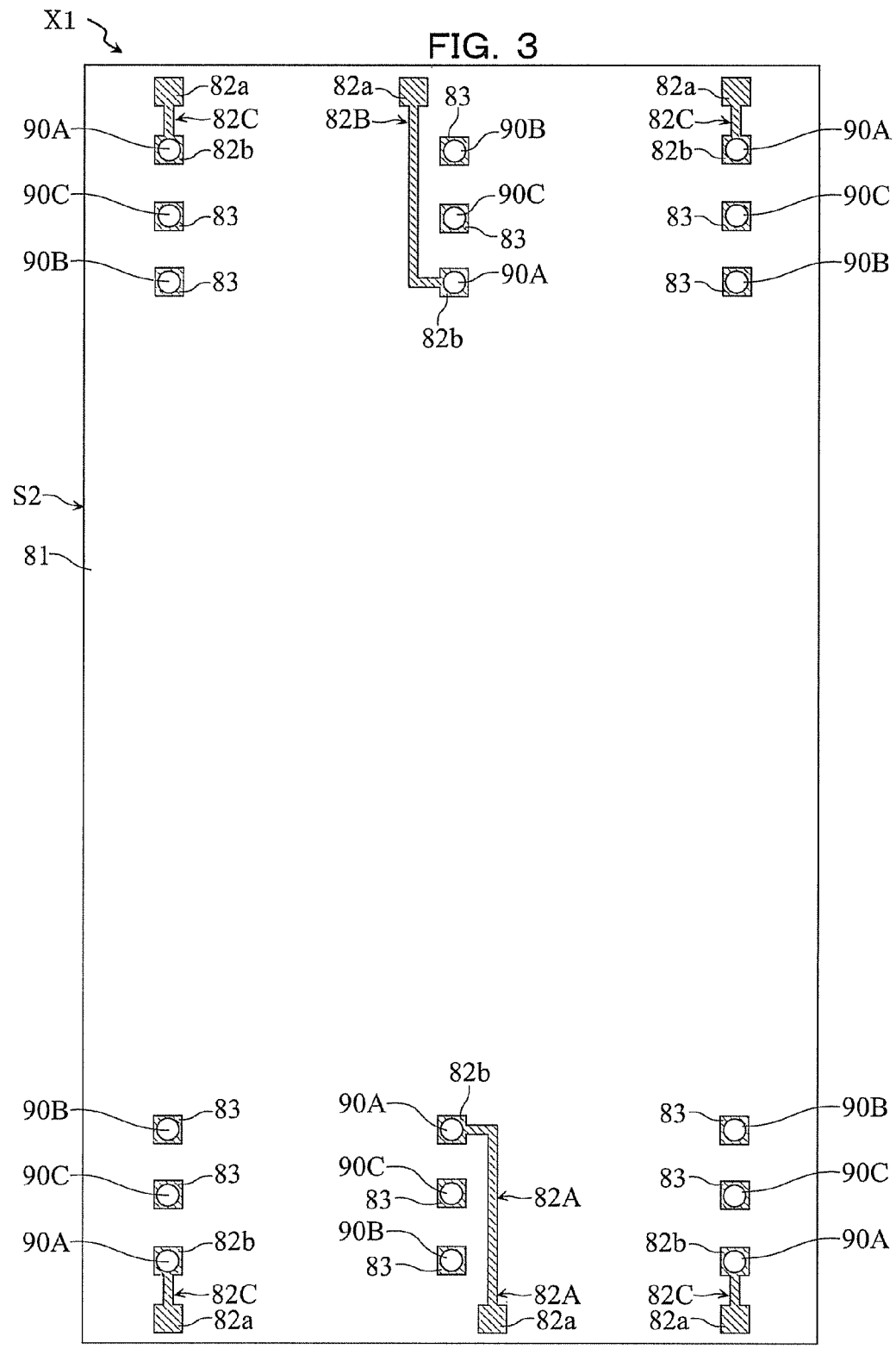
FIG. 3 is a plan view of another part of the micro movable device illustrated in FIG. 1.
Figure 7:
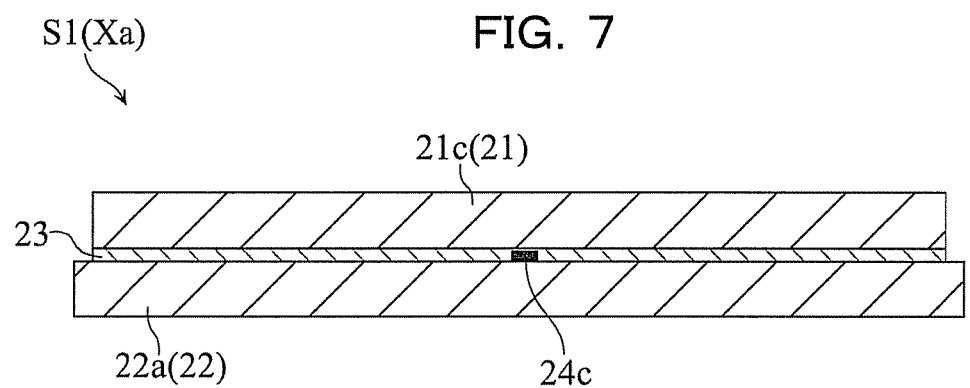
FIG. 7 is a sectional view of FIG. 1 taken along line VII-VII.
Figure 8:
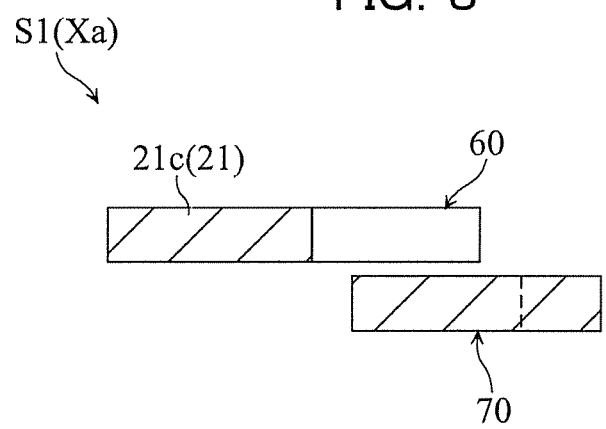
FIG. 8 is a sectional view of FIG. 1 taken along line VIII-VIII.
Figure 9:
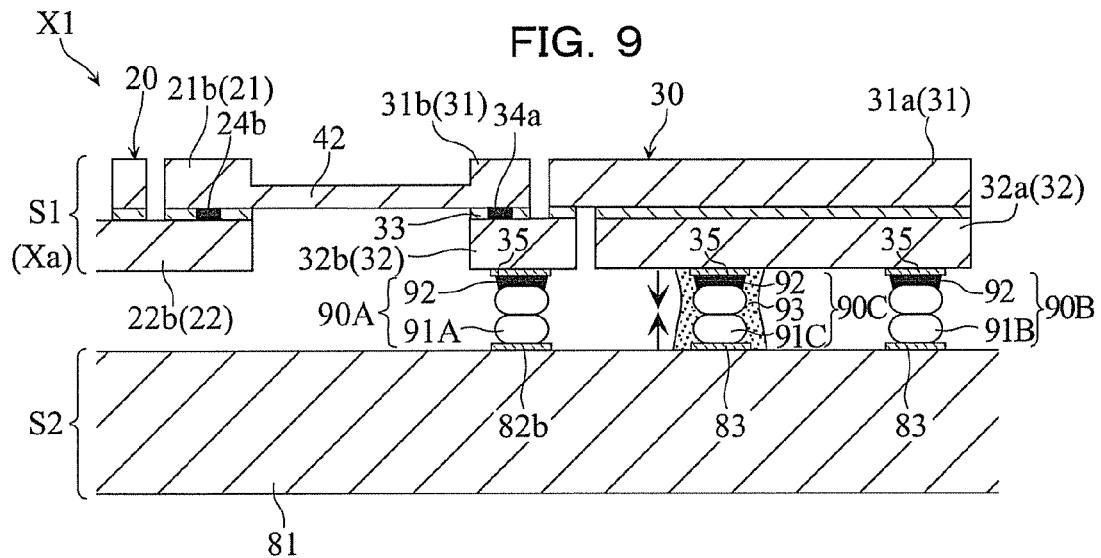
FIG. 9 is a sectional view of FIG. 1 taken along line IX-IX.
Figure 10:
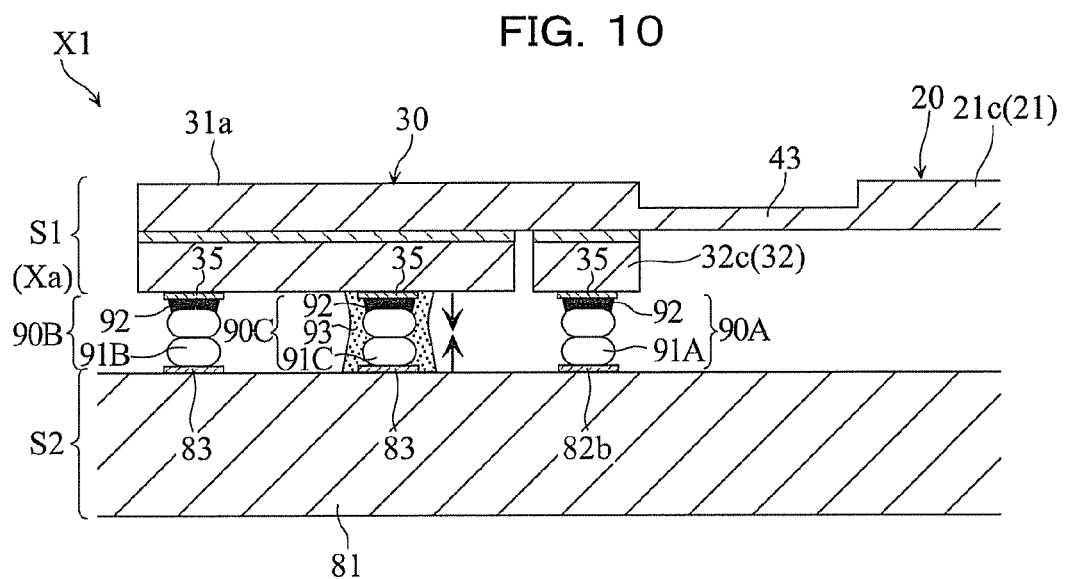
FIG. 10 is a sectional view of FIG. 1 taken along line X-X.
Figure 11:
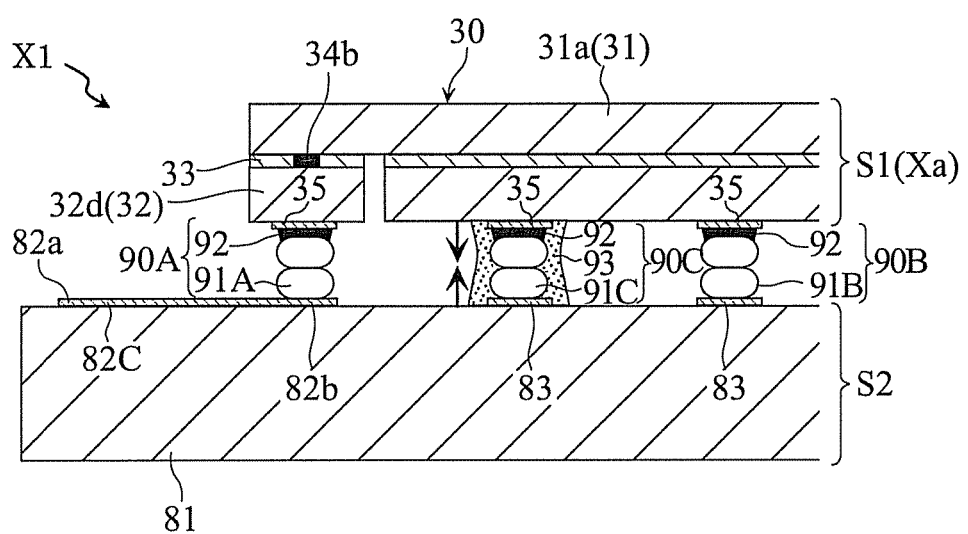
FIG. 11 is a sectional view of FIG. 1 taken along line XI-XI.

FIGS. 1 to 11 illustrate a micro movable device X1 according to a first embodiment. FIG. 1 is a plan view of the micro movable device X1. FIG. 2 is a plan view of a part of the micro movable device X1. FIG. 3 is a plan view of another part of the micro movable device X1. FIGS. 4 to 8 are sectional views of FIG. 1 taken along lines IV-IV, V-V, VI-VI, VII-VII, and VIII-VIII, respectively. FIGS. 9 to 11 are sectional views of FIG. 1 taken along lines IX-IX, X-X, and XI-XI, respectively.

The micro movable device X1 includes a micro movable substrate S1, a wiring board S2, spacers 90A and 90B, and reinforced fixation members 90C. According to the present embodiment, the micro movable device X1 may be used as a micromirror device.

As illustrated in FIG. 1, the micro movable substrate S1 includes a micro movable unit Xa. The micro movable unit Xa includes an oscillating portion 10, frames 20 and 30, a pair of connecting portions 41, a pair of connecting portions 42 and 43, and electrode portions 50, 60, and 70. The micro movable unit Xa is obtained by subjecting a material substrate to processes using bulk micromachining technology, such as micro-electromechanical systems (MEMS) technology. A silicon-on-insulator (SOI) wafer, for example, may be used as the material substrate. The material substrate has a layered structure including a first silicon layer, a second silicon layer, and an insulating layer interposed between the first and second silicon layers. The first and second silicon layers are doped with impurities which apply conductivities to the first and second silicon layers. Each of the above-mentioned portions of the micro movable unit Xa is formed in the first silicon layer or the second silicon layer. To facilitate understanding of the drawings, portions formed in the first silicon layer are shaded in FIG. 1. In FIG. 2, portions of the micro movable unit Xa formed in the second silicon layer are illustrated as provided on the wiring board S2. In other words, in FIG. 2, portions formed in the first silicon layer, portions formed on the first silicon layer, and portions formed in the insulating layer in the micro movable substrate S1 are omitted.

The oscillating portion 10 of the micro movable unit Xa includes a land portion 11, an electrode portion 12, and a beam portion 13.

The land portion 11 is formed in the first silicon layer. The land portion 11 has a mirror surface 11a having a light-reflecting function on a surface thereof. The land portion 11 and the mirror surface 11a function as a movable body of the micro movable unit Xa. A length W (see FIG. 1) of the movable body or the land portion 11 may be, for example, 20 μm to 300 μm.

The electrode portion 12 is also formed in the first silicon layer. The electrode portion 12 includes two arms and a plurality of electrode fingers which extend from the arms. Thus, the electrode portion 12 has a comb-electrode structure. When the micro movable device X1 or the micro movable unit Xa is driven, a reference potential (for example, a ground potential) is supplied to the electrode portion 12.

The beam portion 13 is also formed in the first silicon layer. The beam portion 13 connects the land portion 11 and the electrode portion 12 to each other.

Figure 4:
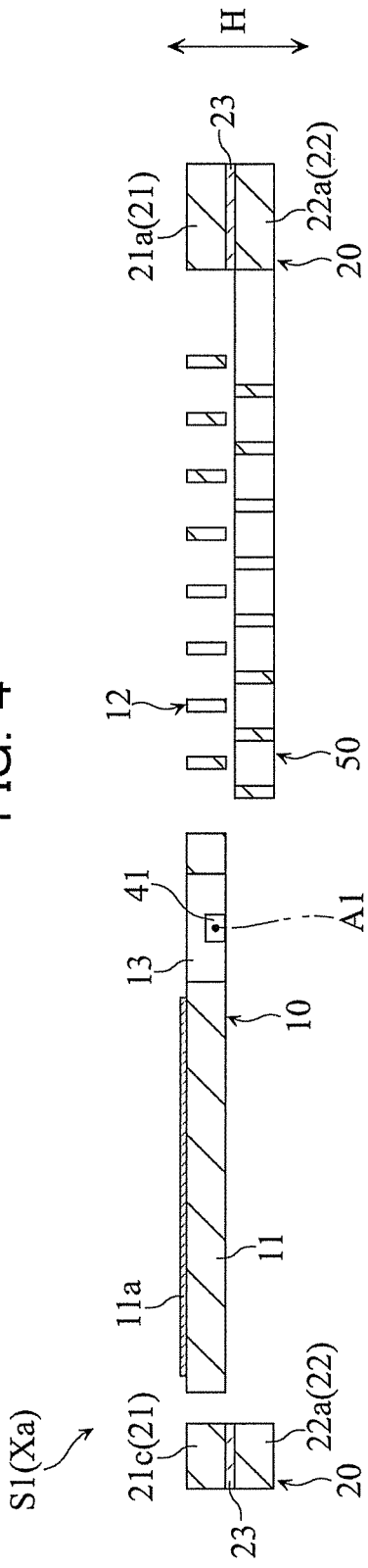
FIG. 4 is a sectional view of FIG. 1 taken along line IV-IV.
Figure 5:
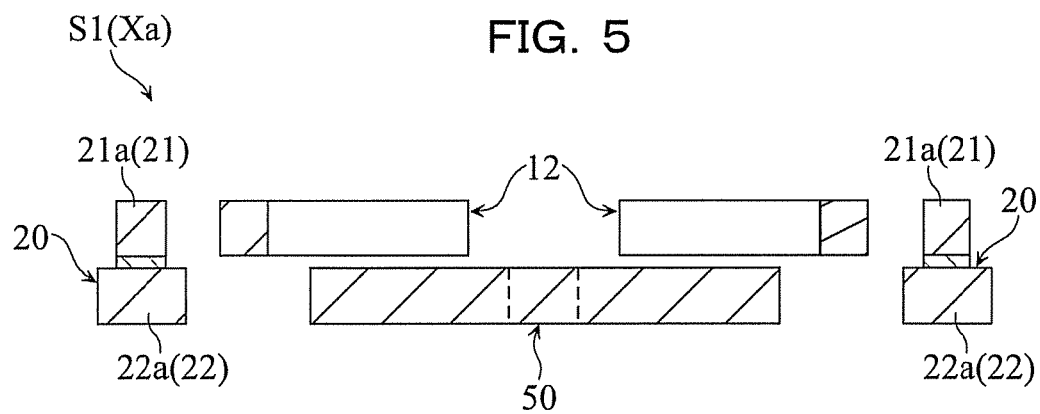
FIG. 5 is a sectional view of FIG. 1 taken along line V-V.
Figure 6:
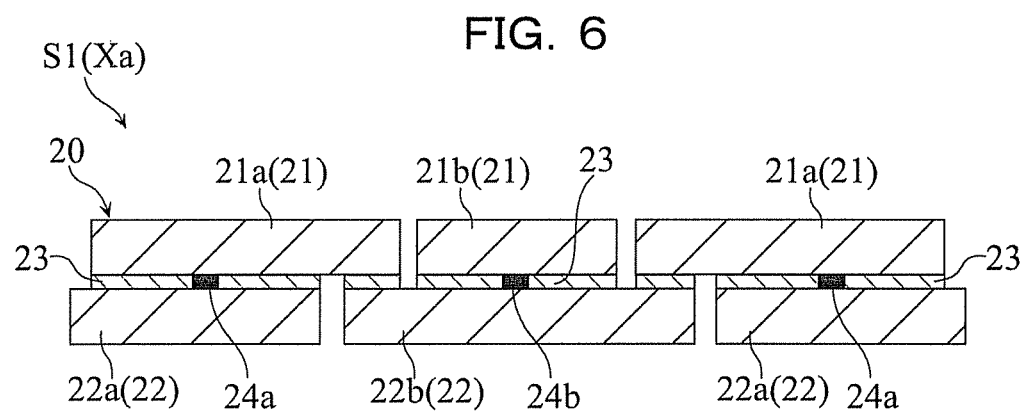
FIG. 6 is a sectional view of FIG. 1 taken along line VI-VI.

As illustrated in FIGS. 4 to 6, the frame 20 includes a first layer 21 formed in the first silicon layer, a second layer 22 formed in the second silicon layer, and an insulating layer 23 interposed between the first and second layers 21 and 22. Thus, the frame 20 has a layered structure. As illustrated in FIG. 1, the first layer 21 includes portions 21a, 21b, and 21c which are separated from each other. As illustrated in FIG. 2, the second layer 22 includes portions 22a and 22b which are separated from each other. As illustrated in FIG. 1, the portion 21a of the first layer 21 is shaped so as to partially surround the oscillating portion 10. The portion 22a of the second layer 22 is a frame body which is shaped so as to partially surround the oscillating portion 10. As illustrated in FIG. 6, the portions 21a and 22a are electrically connected to each other by conductive vias 24a which extend through the insulating layer 23. The portions 21b and 22b are electrically connected to each other by a conductive via 24b which extends through the insulating layer 23. As illustrated in FIG. 7, the portions 21c and 22a are electrically connected to each other by a conductive via 24c which extends through the insulating layer 23.

As illustrated in FIGS. 9 to 11, the frame 30 includes a first layer 31 formed in the first silicon layer, a second layer 32 formed in the second silicon layer, and an insulating layer 33 interposed between the first and second layers 31 and 32. As illustrated in FIG. 1, the first layer 31 includes portions 31a and 31b which are separated from each other. As illustrated in FIG. 2, the second layer 32 includes portions 32a, 32b, 32c, and 32d which are separated from each other. As illustrated in FIG. 9, the portions 31b and 32b are electrically connected to each other by a conductive via 34a which extends through the insulating layer 33. As illustrated in FIG. 11, each of the portions 32d is electrically connected to the portion 31a by a conductive via 34b which extends through the insulating layer 33. In addition, as illustrated in FIGS. 9 to 11, pads 35 are provided on the surfaces of the portions 32a to 32d.

Each of the connecting portions 41 is a torsion bar. The connecting portions 41 are formed in the first silicon layer. The connecting portions 41 connect the beam portion 13 of the oscillating portion 10 to the portion 21a of the first layer 21 of the frame 20. Thus, the oscillating portion 10 and the frame 20 are connected to each other. The beam portion 13 and the portion 21a are electrically connected to each other by the connecting portions 41. As illustrated in FIG. 4, the dimension of the connecting portions 41 in the thickness direction H is smaller than that of the oscillating portion 10, and is also smaller than that of the first layer 21 of the frame 20. The connecting portions 41 define an axial center A1 of rotation of the oscillating portion 10 or the movable body (the land portion 11 and the mirror surface 11a). The direction in which the electrode fingers in the electrode portion 12 extend is parallel to the direction of the axial center A1.

Each of the connecting portions 42 and 43 is a torsion bar. The connecting portions 42 and 43 are formed in the first silicon layer. The connecting portions 42 and 43 connect the frame 20 and the frame 30 to each other. As illustrated in FIG. 1, the connecting portion 42 is connected to the portion 21b of the first layer 21 of the frame 20 and the portion 31b of the first layer 31 of the frame 30. Accordingly, the frame 20 and the frame 30 are connected to each other. The portions 21b and 31b are electrically connected to each other by the connecting portion 42. The connecting portion 43 is connected to the portion 21c of the first layer 21 of the frame 20 and the portion 31a of the first layer 31 of the frame 30. Accordingly, the frame 20 and the frame 30 are connected to each other. The portions 21c and 31a are electrically connected to each other by the connecting portion 43. The dimensions of the connecting portions 42 and 43 in the thickness direction H are smaller than that of the first layer 21 of the frame 20, and are also smaller than that of the first layer 31 of the frame 30. The connecting portions 42 and 43 define an axial center A2 of rotation of the frame 20 and the oscillating portion 10. In the present embodiment, the axial center A2 is perpendicular to the axial center A1.

The electrode portion 50 is formed in the second silicon layer. As illustrated in FIG. 2, the electrode portion 50 includes an arm and a plurality of electrode fingers which extend from the arm. Thus, the electrode portion 50 has a comb-electrode structure. The electrode portion 50 extends from the portion 22b of the second layer 22 of the frame 20.

The electrode portion 60 is formed in the first silicon layer. As illustrated in FIGS. 1 and 8, the electrode portion 60 includes a plurality of electrode fingers which extend in a direction toward the electrode portion 70 from the portion 21c of the first layer 21 of the frame 20. Thus, the electrode portion 60 has a comb-electrode structure.

The electrode portion 70 is formed in the second silicon layer. As illustrated in FIG. 2, the electrode portion 70 includes an arm and a plurality of electrode fingers which extend from the arm in a direction toward the electrode portion 60. Thus, the electrode portion 70 has a comb-electrode structure. The electrode portion 70 extends from the portion 32c of the second layer 32 of the frame 30.

In the micro movable substrate S1 or the micro movable unit Xa, the pair of electrode portions 12 and 50 function as a part of a driving mechanism or an actuator for generating a driving force for rotating the oscillating portion 10 around the axial center A1. The pair of electrode portions 60 and 70 function as a part of a driving mechanism or an actuator for generating a driving force for rotating the frame 20 and the oscillating portion 10 around the axial center A2. In the micro movable substrate S1 or the micro movable unit Xa, the oscillating portion 10, the frame 20, the connecting portions 41, and the electrode portions 50 and 60 form a movable section.

As illustrated in FIG. 3, the wiring board S2 of the micro movable device X1 includes a base 81, wiring patterns 82A, 82B, and 82C, and pads 83. The base 81 is made of a silicon material. Each of the wiring patterns 82A, 82B, and 82C includes pads 82a and 82b. The pads 82a serve as external connection terminals of the micro movable device X1.

As illustrated in FIGS. 9 to 11, each of the spacers 90A includes a bump unit 91A and an adhesive portion 92. The spacers 90A are disposed between the micro movable substrate S1 and the wiring board S2 or between the frame 30 of the micro movable unit Xa and the wiring board S2. In the present embodiment, each of the bump units 91A includes two bumps placed on top of each other. The bumps may be made of, for example, Au. The bump units 91A are pressed against the pads 82b in the wiring patterns 82A, 82B, and 82C on the wiring board S2. In addition, the bump units 91A are joined to the pads 35 on the frame 30 in the micro movable substrate S1 via the adhesive portions 92. The adhesive portions 92 are made of a conductive adhesive containing conductive fillers. The conductive adhesive may be obtained by mixing silver filler into an epoxy adhesive which serves as a main component. A material having a high resistance to ambient temperature is preferably used as the epoxy resin material. In the present embodiment, the spacers 90A having the above-described structure electrically connect the micro movable substrate S1 and the wiring board S2 to each other.

As illustrated in FIGS. 9 to 11, each of the spacers 90B includes a bump unit 91B and an adhesive portion 92. The spacers 90B are disposed between the frame 30 in the micro movable substrate S1 and the wiring board S2. In the present embodiment, each of the bump units 91B includes two bumps placed on top of each other. The bumps may be made of, for example, Au. The bump units 91B are pressed against the pads 83 on the wiring board S2. In addition, the bump units 91B are joined to the pads 35 on the frame 30 in the micro movable substrate S1 by the adhesive portions 92. The adhesive portions 92 may be made of, for example, conductive adhesive.

As illustrated in FIGS. 9 to 11, each of the reinforced fixation members 90C includes a bump unit 91C and adhesive portions 92 and 93. The reinforced fixation members 90C are disposed between the frame 30 in the micro movable substrate S1 and the wiring board S2. In the present embodiment, each of the bump units 91C includes two bumps placed on top of each other. The bumps may be made of, for example, Au. The bump units 91C are pressed against the pads 83 on the wiring board S2. In addition, the bump units 91C are joined to the pads 35 on the frame 30 in the micro movable substrate S1 by the adhesive portions 92. The adhesive portions 92 may be made of, for example, a conductive adhesive. In the reinforced fixation members 90C, the bump units 91C serve as spacer portions. The adhesive portions 93 are made of reinforcing adhesive. The adhesive portions 93 are provided so as to cover the periphery of the bump units 91C. The adhesive portions 93 are joined to the micro movable substrate S1 and the wiring board S2. The reinforcing adhesive may be, for example, an epoxy resin. A material having a high resistance to ambient temperature or a material having bridging silicone particles mixed therein is preferably used as the epoxy resin material. Since the reinforced fixation members 90C are provided, the micro movable substrate S1 and the wiring board S2 may be more strongly fixed to each other compared to only providing the spacers 90A and 90B.

As illustrated in FIGS. 9 to 11, each of the reinforced fixation members 90C is disposed between the corresponding pair of spacers 90A and 90B. The pairs of spacers 90A and 90B and the reinforced fixation members 90C illustrated in FIGS. 9 to 11 are arranged in a line parallel to the axial center A2 of the micro movable unit Xa, as illustrated in FIG. 2. The pair of spacers 90A and 90B and the reinforced fixation member 90C illustrated in FIG. 9 are joined to the frame 30 at positions along the axial center A2. The pair of spacers 90A and 90B and the reinforced fixation member 90C illustrated in FIG. 10 are also joined to the frame 30 at positions along the axial center A2. The axial center A2 is a center of rotation of the movable section (the oscillating portion 10, the frame 20, the connecting portions 41, the electrode portion 50, and the electrode portion 60) with respect to a fixed section or the frame 30, and is defined by the connecting portions 42 and 43.

When the micro movable device X1 is driven, the reference potential is applied to the electrode portion 12 of the oscillating portion 10 and the electrode portion 60. The reference potential is applied to the electrode portion 12 through the wiring patterns 82C (including the pads 82a which serve as external connection terminals) on the wiring board S2, the spacers 90A on the pads 82b of the wiring patterns 82C, the pads 35 provided on the micro movable substrate S1 and joined to the spacers 90A, the portions 32d of the second layer 32 of the frame 30 in the micro movable substrate S1, the conductive vias 34b, the portion 31a of the first layer 31, the connecting portion 43, the portion 21c of the first layer 21 of the frame 20, the conductive via 24c, the portion 22a of the second layer 22, the conductive vias 24a, the portion 21a of the first layer 21, the connecting portions 41, and the beam portion 13 of the oscillating portion 10. The reference potential is applied to the electrode portion 60 through the wiring patterns 82C (including the pads 82a which serve as external connection terminals) on the wiring board S2, the spacers 90A on the pads 82b of the wiring patterns 82C, the pads 35 provided on the micro movable substrate S1 and joined to the spacers 90A, the portions 32d of the second layer 32 of the frame 30 in the micro movable substrate S1, the conductive vias 34b, the portion 31a of the first layer 31, the connecting portion 43, and the portion 21c of the first layer 21 of the frame 20. The reference potential may be, for example, a ground potential and is preferably maintained constant.

In this state, a drive potential, which is higher than the reference potential, is applied to each of the electrode portions 50 and 70 if necessary. When an electrostatic attractive force is generated between the electrode portions 12 and 50, the oscillating portion 10 rotates around the axial center A1, as illustrated in FIG. 12. When an electrostatic attractive force is generated between the electrode portions 60 and 70, the frame 20 and the oscillating portion 10 rotate around the axial center A2. Thus, the micro movable device X1 functions as a two-axis movable device. The drive potential is applied to the electrode portion 50 through the wiring pattern 82A (including the pad 82*a* which serves as an external connection terminal) on the wiring board S2, the spacer 90A on the pad 82*b* of the wiring pattern 82A, the pad 35 provided on the micro movable substrate S1 and joined to the spacer 90A, the portion 32*b* of the second layer 32 of the frame 30 in the micro movable substrate S1, the conductive via 34*a*, the portion 31*b* of the first layer 31, the connecting portion 42, the portion 21*b* of the first layer 21 of the frame 20, the conductive via 24*b*, and the portion 22*b* of the second layer 22. The drive potential is applied to the electrode portion 70 through the wiring pattern 82B (including the pad 82*a* which serves as an external connection terminal) on the wiring board S2, the spacer 90A on the pad 82*b* of the wiring pattern 82B, the pad 35 provided on the micro movable substrate S1 and joined to the spacer 90A, and the portion 32*c* of the second layer 32 of the frame 30 in the micro movable substrate S1. Due to the above-described rotation around the two axes, the direction in which light is reflected by the mirror surface 11*a* provided on the land portion 11 of the micro movable unit Xa included in the micro movable device X1 may be changed.

The micro movable device X1 may also be used as a sensing device, such as an angular velocity sensor or an acceleration sensor. When the micro movable device X1 is used as a micro sensing device, it is not necessary to provide the mirror surface 11*a* on the land portion 11 of the oscillating portion 10 in the micro movable unit Xa.

When the micro movable device X1 is used as an angular velocity sensor, the movable section (the oscillating portion 10, the frame 20, the connecting portions 41, the electrode portion 50, and the electrode portion 60) may be rotated, for example, around the axial center A2 at a specific frequency or period. The movable section may be rotated by applying a voltage between the electrode portions 60 and 70 at a specific period. In the present embodiment, for example, the electrode portion 60 is connected to the ground potential while a potential is applied to the electrode portion 70 at a specific period.

If an angular velocity is applied to the micro movable device X1 or the oscillating portion 10 while the movable section is being vibrated in the above-described manner, the oscillating portion 10 rotates around the axial center A1. Thus, the positional relationship between the electrode portions 12 and 50 changes and the capacitance between the electrode portions 12 and 50 changes accordingly. The amount of rotation of the oscillating portion 10 may be detected based on the change in the capacitance. The angular velocity applied to the micro movable device X1 or the oscillating portion 10 may be calculated based on the detection result of the amount of rotation.

When the micro movable device X1 is used as an acceleration sensor, a direct-current voltage is applied between the electrode portions 12 and 50. Thus, the oscillating portion 10 is put into a stationary state with respect to the frame 20 and the electrode portion 50. In this state, if an acceleration is applied to the micro movable device X1 or the oscillating portion 10 in the direction of a normal line (in a direction perpendicular to the plan view illustrated in FIG. 1), an inertial force having a vector component parallel to the acceleration is generated. Accordingly, a rotational torque around the axial center A1 is applied to the oscillating portion 10. As a result, the oscillating portion 10 rotates around the axial center A1 such that the rotational displacement of the oscillating portion 10 is proportional to the acceleration. Referring to the plan view illustrated in FIG. 1, the above-mentioned inertial force may be generated when the structure is designed such that the center of gravity of the oscillating portion 10 does not coincide with the axial center A1. The rotational displacement is electrically detected based on a change in the capacitance between the electrode portions 12 and 50. The acceleration applied to the micro movable device X1 or the oscillating portion 10 may be calculated based on the result of detection of the capacitance.

FIGS. 13A to 16B illustrate an example of a method for manufacturing the micro movable device X1. FIGS. 13A to 14D illustrate an example of a method for manufacturing the micro movable substrate S1 included in the micro movable device X1. This method is one of methods for forming the micro movable unit Xa using bulk micromachining technology. The sectional views illustrated in FIGS. 13A to 14D illustrate the processing for forming a land portion L, a beam portion B, frames F1, F2, and F3, connecting portions C1 and C2, and a pair of electrodes E1 and E2 illustrated in FIG. 14D. The land portion L corresponds to a part of the land portion 11. The beam portion B corresponds to the beam portion 13. The frame F1 corresponds to a part of the frame 20. The frames F2 and F3 correspond to parts of the frame 30. The connecting portion C1 corresponds to the connecting portions 41. The connecting portion C2 corresponds to each of the connecting portions 41, 42, and 43. The electrode E1 corresponds to a part of each of the electrode portions 12 and 60. The electrode E2 corresponds to a part of each of the electrode portions 50 and 70. FIGS. 15A to 15C illustrate processing for processing the wiring board S2. FIGS. 16A and 16B illustrate a processing of joining the micro movable substrate S1 and wiring board S2 to each other (substrate bonding processing).

Figure 13A:
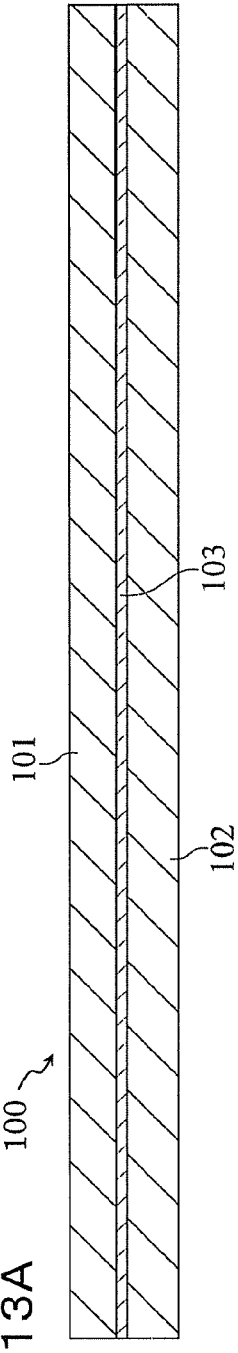
FIGS. 13A to 13D are diagrams illustrating manufacturing processing of the micro movable device illustrated in FIG. 1.

In the process of forming the micro movable unit Xa, first, a material substrate 100 is prepared, as illustrated in FIG. 13A. The material substrate 100 includes silicon layers 101 and 102 and an insulating layer 103 interposed between the silicon layers 101 and 102. An SOI wafer, for example, having a layered structure may be used as the material substrate 100. Conductive vias, which serve as the above-described conductive vias 24*a* to 24*c*, 34*a*, and 34*b*, are formed in the insulating layer 103 of the material substrate 100 in advance. The silicon layers 101 and 102 are doped with impurities to apply conductivity thereto. The impurities may be p-type impurities, such as B, or n-type impurities, such as P and Sb. The insulating layer 103 may be made of, for example, silicon oxide. The thickness of the silicon layer 101 may be, for example, 10 μm to 100 μm. The thickness of the silicon layer 102 may be, for example, 50 μm to 500 μm. The thickness of the insulating layer 103 may be, for example, 0.3 μm to 3 μm.

Figure 13B:
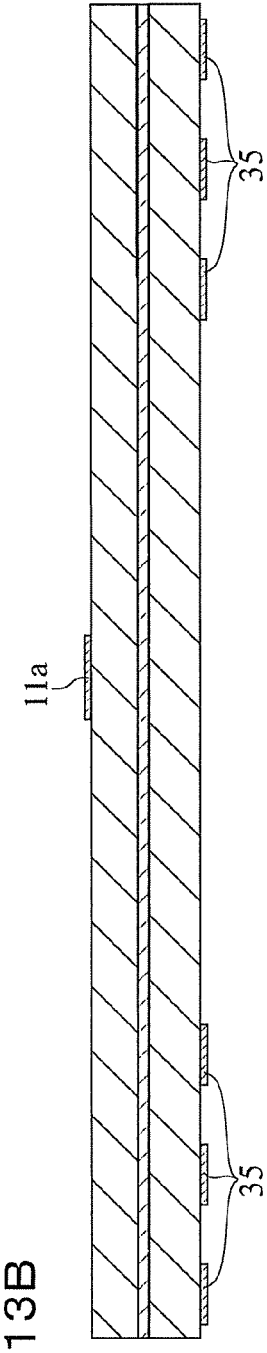

As illustrated in FIG. 13B, the mirror surface 11*a* is formed on the silicon layer 101. In addition, the pads 35 are formed on the silicon layer 102. In the process of forming the mirror surface 11*a*, first, a metal film, such as a Cr film, is formed on the silicon layer 101 by sputtering. Then, another metal film, such as an Au film, is formed on the Cr film. The thickness of the Cr film may be, for example, 50 nm. The thickness of the Au film may be, for example, 200 nm. Then, the metal films are formed into a certain pattern by etching using a mask. Thus, the mirror surface 11*a* is formed. A solution of potassium iodide and iodine, for example, may be used as an etchant for Au. A solution of di-ammonium cerium (IV)

nitrate, for example, may be used as an etchant for Cr. The pads 35 are formed on the silicon layer 102 by a process similar to for the process for forming the mirror surface 11*a*.

Figure 13C:
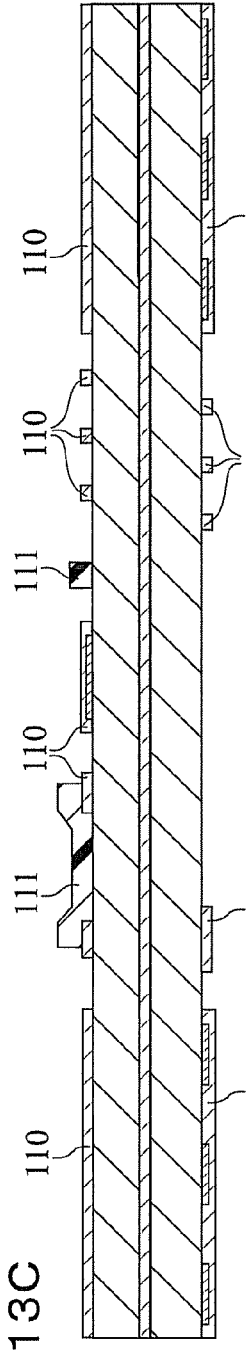
Figure 17:
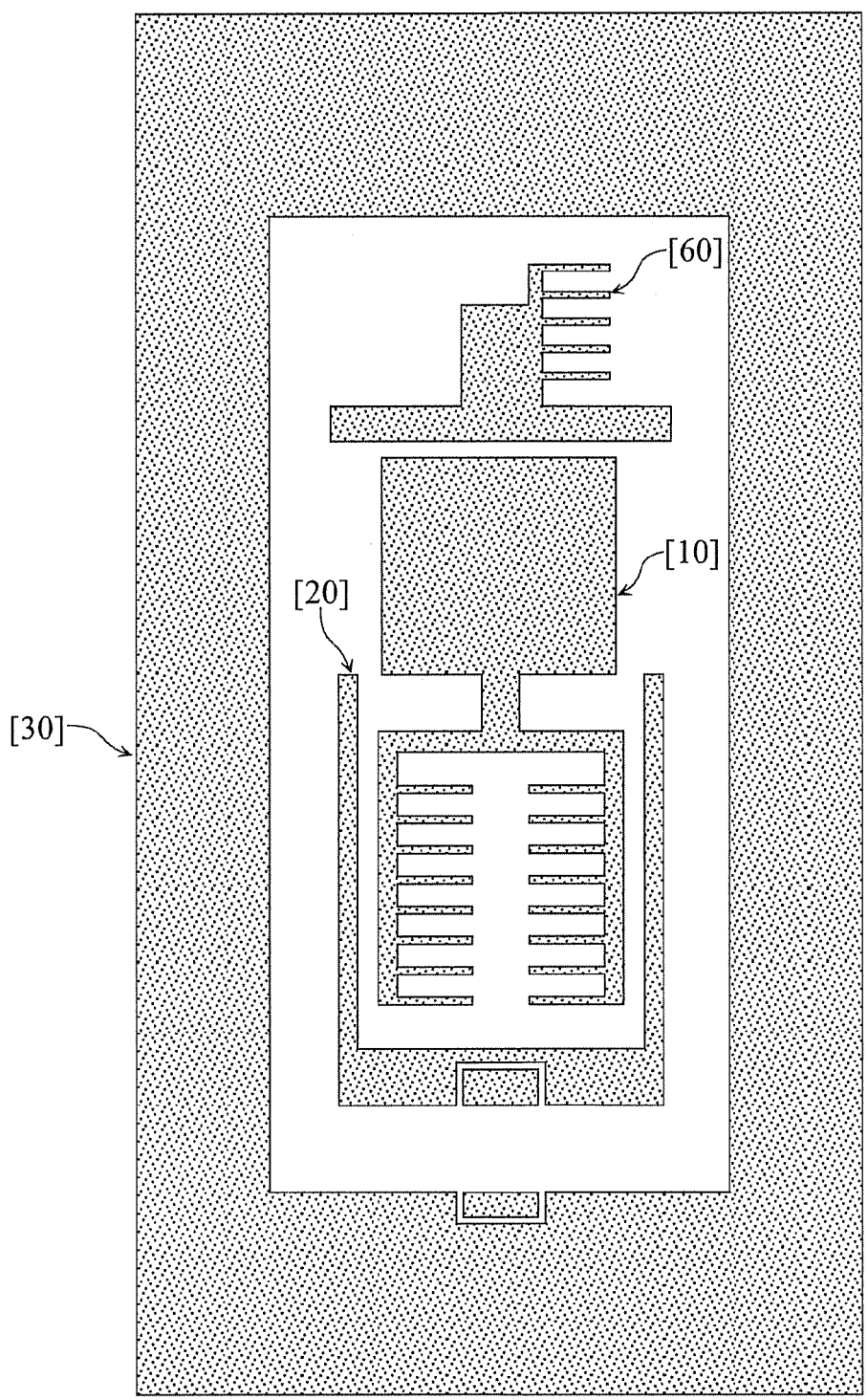
FIG. 17 is a plan view illustrating a mask pattern.

As illustrated in FIG. 13C, an oxide film pattern 110 and a resist pattern 111 are formed on the silicon layer 101. In addition, an oxide film pattern 112 is formed on the silicon layer 102. The oxide film pattern 110 has a shape corresponding to the oscillating portion 10 (the land portion 11, the electrode portion 12, and the beam portion 13), the first layer 21 of the frame 20, the first layer 31 of the frame 30, and the electrode portion 60, all of which are to be formed in the silicon layer 101. The shape of the oxide film pattern 110 is illustrated in FIG. 17. The resist pattern 111 has a shape corresponding to the connecting portions 41 to 43. The oxide film pattern 112 has a shape corresponding to the second layer 22 of the frame 20, the second layer 32 of the frame 30, and the electrode portions 50 and 70, all of which are to be formed in the silicon layer 102. The shape of the oxide film pattern 112 is illustrated in FIG. 18.

Figure 13D:
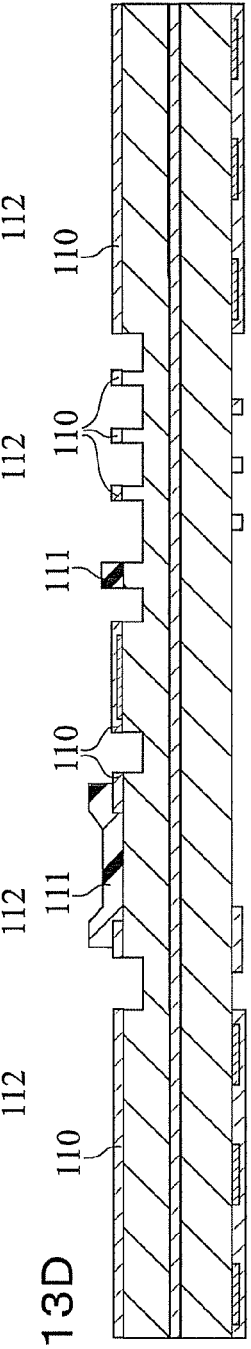

As illustrated in FIG. 13D, the silicon layer 101 is etched to a specific depth by deep reactive ion etching (DRIE) using the oxide film pattern 110 and the resist pattern 111 as masks. The specific depth is a depth corresponding to the thickness of the connecting portions C1 and C2, and is set to, for example, 5 μm. In the DRIE, the Bosch process may be used. The Bosch process is a process in which etching using SF6 gas and side wall protection using C4F8 gas are alternately performed. If the Bosch process is used, satisfactory anisotropic etching may be achieved. The Bosch process may also be used in the DRIE described below.

As illustrated in FIG. 14A, the resist pattern 111 is removed. The resist pattern 111 may be removed by, for example, exposing the resist pattern 111 to a releasing agent.

As illustrated in FIG. 14B, the silicon layer 101 is etched down to the insulating layer 103 by DRIE using the oxide film pattern 110 as a mask. The etching is performed such that the connecting portions C1 and C2 remain. As a result, the land portion L, the beam portion B, the electrode E1, a part of the frame F1 (the first layer 21 of the frame 20), a part of the frame F2 (the first layer 31 of the frame 30), a part of the frame F3 (the first layer 31 of the frame 30), and the connecting portions C1 and C2 are formed.

As illustrated in FIG. 14C, the silicon layer 102 is etched down to the insulating layer 103 by DRIE using the oxide film pattern 112 as a mask. As a result, another part of the frame F1 (the second layer 22 of the frame 20), another part of the frame F2 (the second layer 32 of the frame 30), another part of the frame F3 (the second layer 32 of the frame 30), and the electrode E2 are formed.

As illustrated in FIG. 14D, exposed portions of the insulating layer 103 and the oxide film patterns 110 and 112 are etched away. As an etching method, either dry etching or wet etching may be used. When dry etching is used, CF4, CHF3, etc., may be used as an etching gas. When wet etching is used, buffered hydrogen fluoride (BHF) including fluorinated acid and ammonium fluoride may be used as an etchant. After this processing, the material substrate 100 is cut so as to separate micro movable units Xa from each other.

By performing the above-described procedure, the micro movable substrate S1 including the micro movable unit Xa is manufactured.

In the process of manufacturing the micro movable device X1, as illustrated in FIG. 15A, the bump units 91A, 91B, and 91C are formed on the wiring board S2. The wiring patterns 82A, 82B, and 82C including the pads 82*a* and 82*b* and the pads 83 are formed in advance on the surface of the wiring board S2. In this way, two bumps are stacked on each of the pads 82*b* and 83 using a bump bonder. Thus, a plurality of double-bump structures are formed. The pads and the bumps are pressure-bonded to one another. Next, a leveling processing is performed to make the heights of the double-bump structures uniform. Thus, the bump units 91A to 91C are formed. The leveling processing may be performed by, for example, pressing a flat surface of a glass plate or the like against top portions of the double-bump structures.

As illustrated in FIG. 15B, thermosetting conductive adhesive 92' is applied to the top portions of the bump units 91A to 91C. For example, the bump units 91A to 91C on the wiring board S2 are brought into contact with a flat substrate on which the conductive adhesive 92' is applied at a uniform thickness (for example, 25 μm). The conductive adhesive 92' may be transferred onto the top portions of the bump units 91A to 91C by using the above-described method.

As illustrated in FIG. 15C, thermosetting reinforcing adhesive 93' is applied to the bump units 91C. For example, the reinforcing adhesive 93' is applied to the bump units 91C with a dispenser such that the bump units 91C are covered by the reinforcing adhesive 93'. The amount of reinforcing adhesive 93' provided so as to cover each of the bump units 91C may be larger than the amount of conductive adhesive 92' applied only to the top portion of each of the bump units 91A to 91C.

After the reinforcing adhesive 93' is applied, as illustrated in FIGS. 16A and 16B, the micro movable substrate S1 and the wiring board S2 are joined to each other such that the bump units 91A to 91C, the conductive adhesive 92', and the reinforcing adhesive 93' are disposed therebetween. In this processing, the conductive adhesive 92' and the reinforcing adhesive 93' are cured by applying heat, so that the adhesive portions 92 and 93 are formed.

Thus, the micro movable device X1 is manufactured which includes the micro movable substrate S1, the wiring board S2, and the spacers 90A and 90B and the reinforced fixation members 90C which are disposed between the micro movable substrate S1 and the wiring board S2 to join them together.

In the process of joining the micro movable substrate S1 and the wiring board S2 to each other, the adhesive portions 93 of the reinforced fixation members 90C are formed by curing a large amount of reinforcing adhesive 93' applied to the bump units 91C. The reinforcing adhesive 93' contracts when it is cured. Therefore, a stress is applied to the frame 30 in the micro movable substrate S1 at positions where the reinforced fixation members 90C are joined. For example, a tensile stress is applied in a direction such that the distance between the micro movable substrate S1 and the wiring board S2 decreases. However, as illustrated in FIGS. 9 to 11, each of the reinforced fixation members 90C including the adhesive portions 93 is disposed between the corresponding pair of spacers 90A and 90B. Therefore, in the micro movable device X1, the frame 30 may be prevented from being deformed by the above-described stress. The spacers 90A and 90B and the reinforced fixation members 90C disposed therebetween resist the stress applied to the frame 30 at positions where the reinforced fixation members 90C are joined. Therefore, the boundary between the adhesive portion 93 of each reinforced fixation member 90C and the micro movable substrate S1 serves as a power point and the boundary between each of the spacers 90A and 90B and the micro movable substrate S1 serves as a fulcrum, so that deformation of the frame 30 is prevented. As a result, in the micro movable device X1, spring constants of the connecting portions 42 and 43 after the processing of joining the micro movable substrate S1 and the wiring board S2 to each other may be prevented from being changed due to the joining. Changes in the spring constants of the connecting portions 42 and 43, which are connected to the frame 30, may be caused by the deformation of the frame 30.

In addition, in the manufactured micro movable device X1, the volume of the adhesive portion 93 of each reinforced fixation member 90C varies in accordance with the temperature variation. Therefore, a stress is applied to the frame 30 in the micro movable substrate S1 at positions where the reinforced fixation members 90C are joined. However, as illustrated in FIGS. 9 to 11, each of the reinforced fixation members 90C including the adhesive portions 93 is disposed between the corresponding pair of spacers 90A and 90B with which the micro movable substrate S1 and the wiring board S2 are joined to each other. Therefore, in the micro movable device X1, the frame 30 may be prevented from being deformed by the above-described stress. The spacers 90A and 90B and the reinforced fixation members 90C resist the stress applied to the frame 30 at positions where the reinforced fixation members 90C are joined. Therefore, the boundary between the adhesive portion 93 of each reinforced fixation member 90C and the micro movable substrate S1 serves as a point of force and the boundary between each of the spacers 90A and 90B and the micro movable substrate S1 serves as a fulcrum, so that deformation of the frame 30 may be prevented. As a result, in the micro movable device X1, spring constants of the connecting portions 42 and 43 after the processing of joining the micro movable substrate S1 and the wiring board S2 to each other may be prevented from being changed due to the joining.

As described above, the spring constants of the connecting portions 42 and 43, which connect the movable section (the oscillating portion 10, the frame 20, the connecting portions 41, the electrode portion 50, and the electrode portion 60) to the frame 30, may be prevented from being changed during the manufacturing process of the micro movable device X1 or after the manufacturing process of the micro movable device X1. In this type of micro movable device X1, variations in mechanical characteristics, such as the resonance frequency of the movable section, may be adequately suppressed. Therefore, degradation of performance of the device may be suppressed.

In the micro movable device X1, the base material of the micro movable substrate S1 is a silicon material, as described above. The base 81, which is the base material of the wiring board S2, is also made of a silicon material, as described above. Therefore, a difference between a change in the volume of the micro movable substrate S1 and a change in the volume of the wiring board S2 (support base) due to temperature variation may be reduced. As a result, a stress applied to the frame 30 in the micro movable substrate S1 at positions where the reinforced fixation members 90C are joined may be reduced.

Figure 19A:
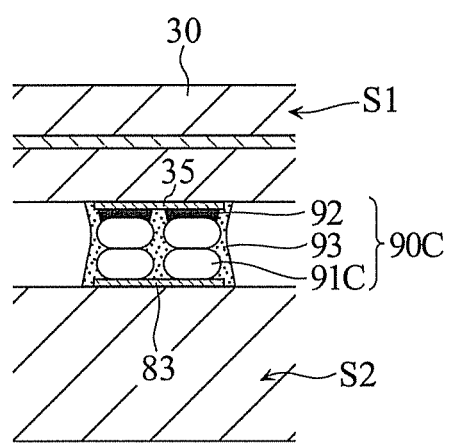
FIG. 19A is a sectional view of a reinforced fixation member, according to a modification taken along a thickness direction of a wiring board.
Figure 19B:
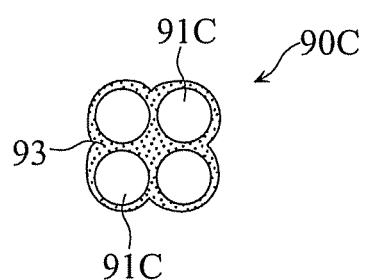
FIG. 19B is a sectional view of the reinforced fixation member according to the modification taken along a planar direction of the wiring board.

FIGS. 19A and 19B illustrate a modification of the reinforced fixation members 90C. FIG. 19A is a sectional view of a reinforced fixation member 90C according to the modification taken along a thickness direction of the wiring board S2. FIG. 19B is a sectional view of the reinforced fixation member 90C according to the modification taken along a direction in which the wiring board S2 extends. Referring to FIGS. 19A and 19B, the reinforced fixation member 90C includes a plurality of bump units 91C. Each of the bump units 91C includes two bumps, such as Au bumps, which are placed on top of each other. The bump units 91C are pressed against a single pad 83 provided on the wiring board S2. In addition, the bump units 91C are joined to a corresponding pad 35 provided on the frame 30 in the micro movable substrate S1 by respective adhesive portions 92. The adhesive portions 92 are made of a conductive adhesive. The conductive adhesive contains conductive filler. The adhesive portion 93 is made of a reinforcing adhesive. The adhesive portion 93 is provided so as to cover the periphery of the bump units 91C and join the micro movable substrate S1 and the wiring board S2 to each other. In this structure, the volume ratio of the adhesive portion 93 is smaller than that in the case where a single bump unit 91C is included in the reinforced fixation member 90C. Therefore, in the process of curing the reinforcing adhesive 93', a frictional force is effectively generated at the boundary between the reinforcing adhesive 93', which contracts in the curing process, and the bump units 91C. As a result, the contraction of the reinforcing adhesive 93' is suppressed. The above-mentioned frictional force is applied so as to resist the contraction of the reinforcing adhesive 93'. Therefore, as illustrated in FIGS. 19A and 19B, the reinforced fixation member 90C including the plurality of bump units 91C contributes to suppressing the variation in the spring constants of the connecting portions 42 and 43.

In the micro movable device X1, the pairs of spacers 90A and 90B and the strong fixation portions 90C illustrated in FIGS. 9 to 11 are arranged in a line parallel to the axial center A2 of the micro movable unit Xa. In addition, the pair of spacers 90A and 90B and the reinforced fixation portion 90C illustrated in FIG. 9 are joined to the frame 30 at positions on the axial center A2. The pair of spacers 90A and 90B and the strong fixation portion 90C illustrated in FIG. 10 are also joined to the frame 30 at positions on the axial center A2.

The shape of the pattern of the portions 32a to 32d of the second layer 32 of the frame 30 in the micro movable substrate S1, the shape of the wiring patterns 82A to 82C and the pattern of the pads 83 on the wiring board S2, and the arrangement of each set of the spacers 90A and 90B and the reinforced fixation member 90C, which are arranged in a single row, may be changed such that the micro movable substrate S1 and the wiring board S2 are electrically connected to each other by specific reinforced fixation members 90C. The micro movable substrate S1 and the wiring board S2 may be electrically connected to each other only by the reinforced fixation members 90C.

Figure 20:
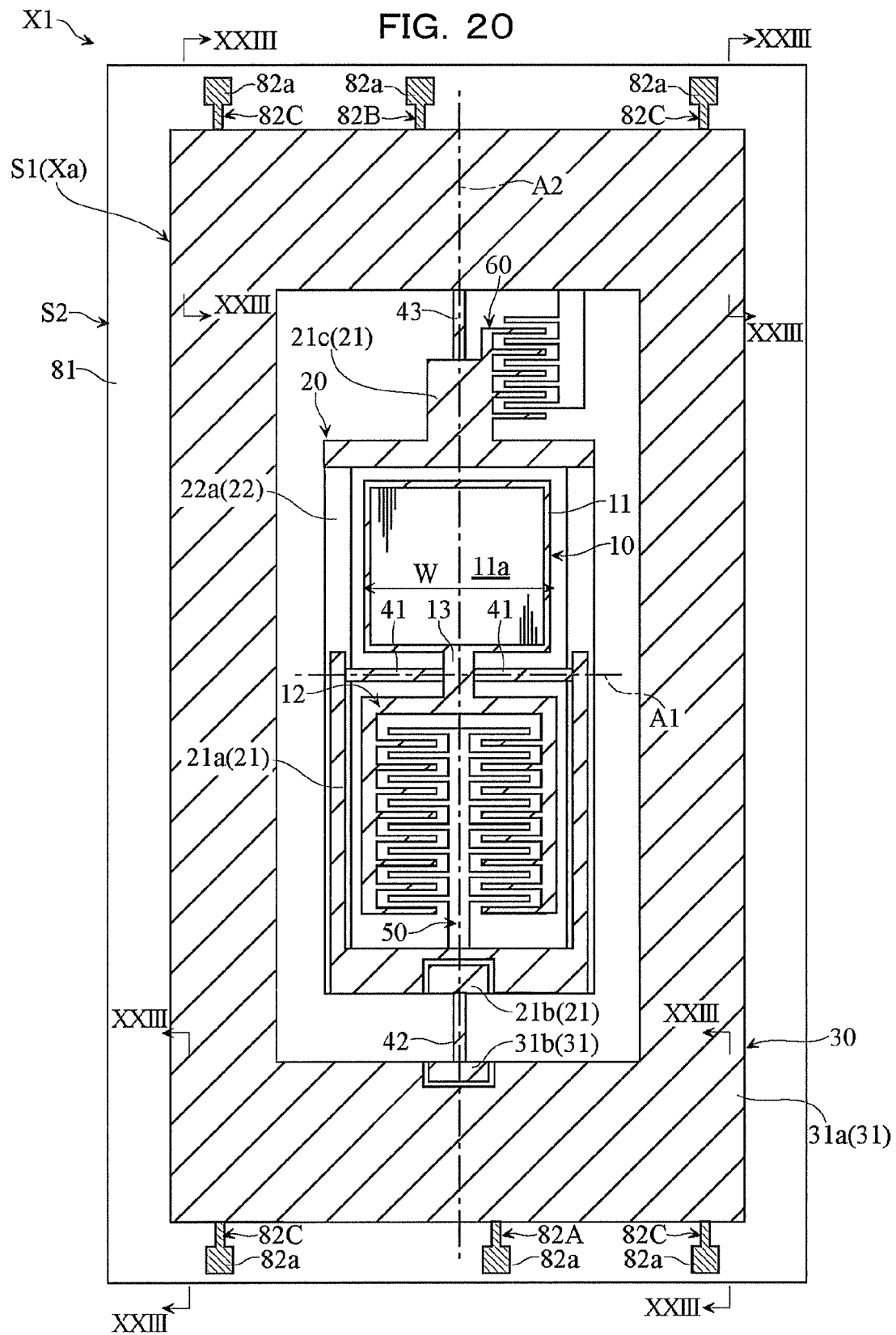
FIG. 20 is a plan view of a micro movable device according to another modification.
Figure 21:
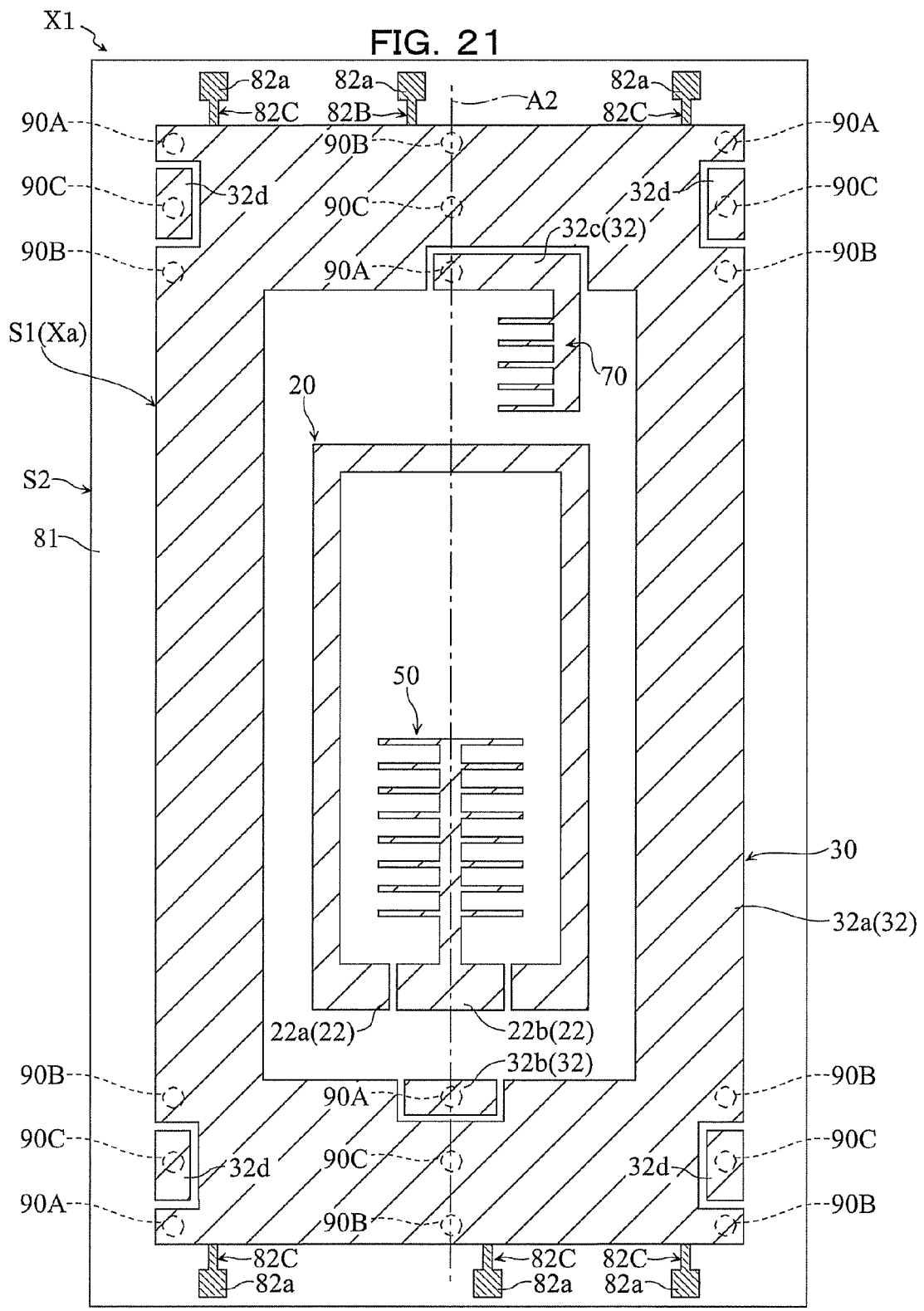
FIG. 21 is a plan view of a part of the micro movable device illustrated in FIG. 20.
Figure 22:
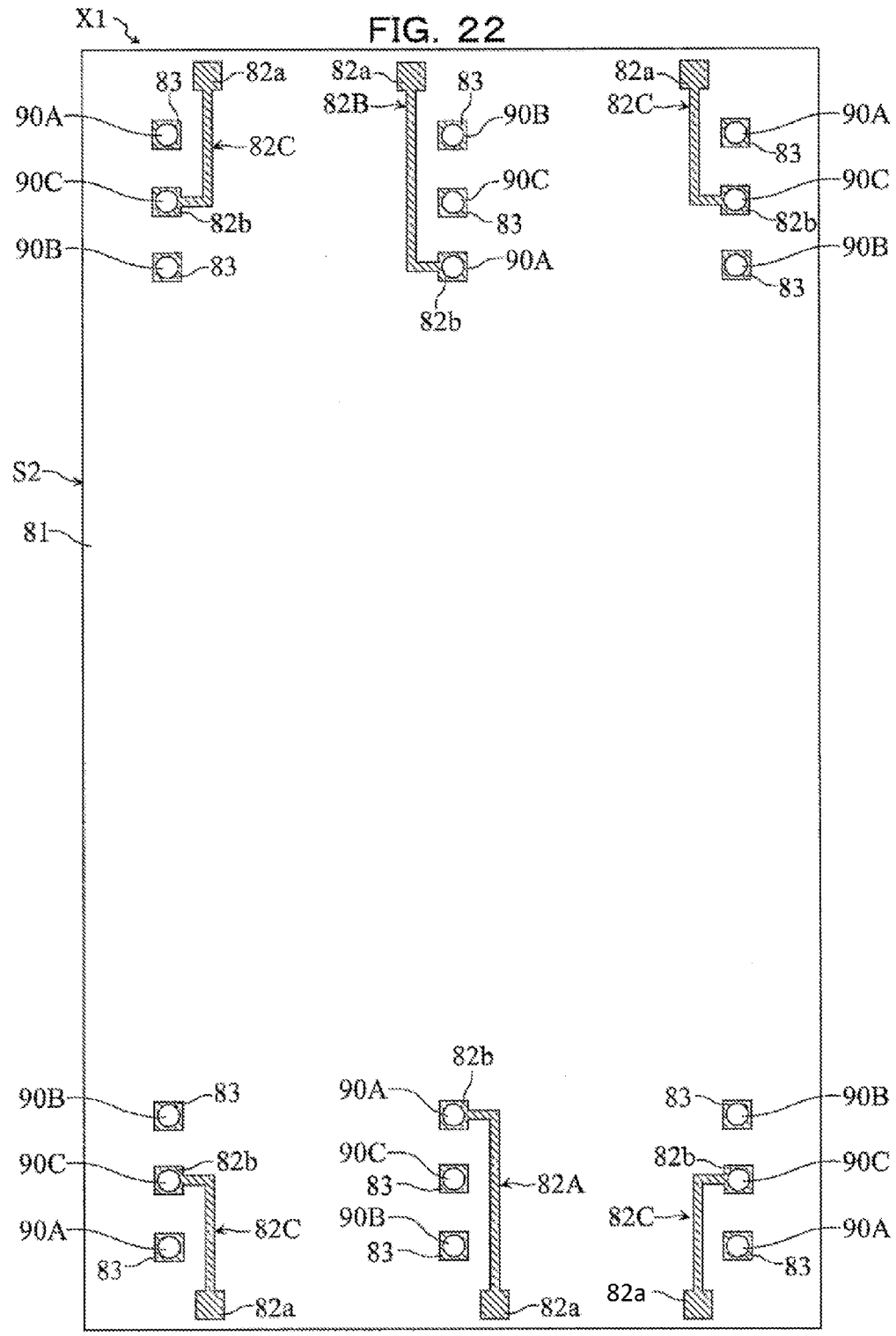
FIG. 22 is a plan view of another part of the micro movable device illustrated in FIG. 20.
Figure 23:
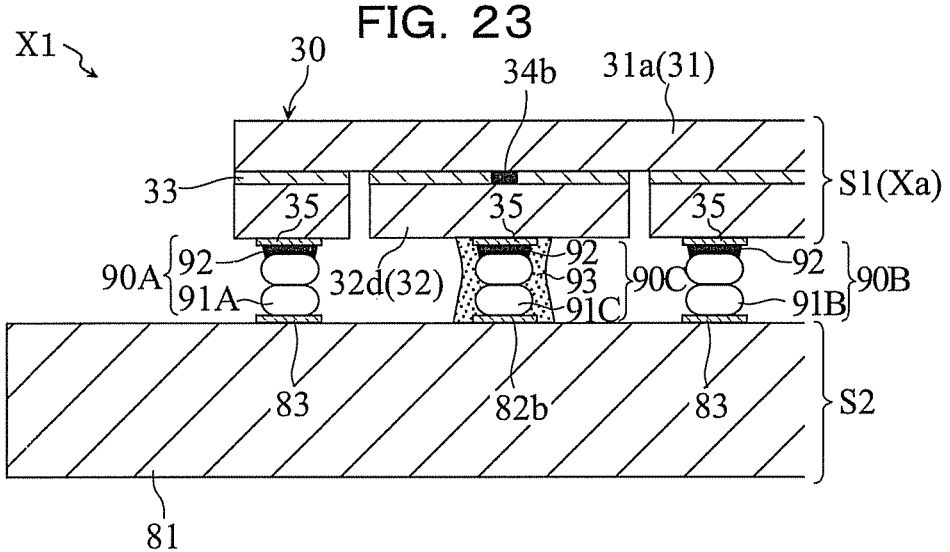
FIG. 23 is a sectional view of FIG. 20 taken along line XXIII-XXIII.

FIGS. 20 to 23 illustrate a modification of the micro movable device X1. FIG. 20 is a plan view of the micro movable device X1 according to the modification. FIG. 21 is a plan view of a part of the micro movable device X1 illustrated in FIG. 20. FIG. 22 is a plan view of another part of the micro movable device X1 illustrated in FIG. 20. FIG. 23 is a sectional view of FIG. 20 taken along line XXIII-XXIII.

As illustrated in FIGS. 20 to 23, in the micro movable device X1, the reinforced fixation members 90C are disposed, instead of the spacers 90A, on conductive paths for applying a reference potential to the electrode portions 12 and 60. In this point, the micro movable device X1 according to the present modification differs from the micro movable device X1 illustrated in FIGS. 1 to 11. In the micro movable device X1 illustrated in FIGS. 20 to 23, the reinforced fixation members 90C are joined to the pads 82b of the wiring patterns 82C on the wiring board S2. The pads 82b and the bump units 91C are pressure-bonded to each other. The reinforced fixation members 90C are joined to the pads 35 on the surfaces of the portions 32d of the second layer 32 of the frame 30 in the micro movable substrate S1. The bump units 91C are joined to the pads 35 with the adhesive portions 92 disposed therebetween. The reference potential is applied to the electrode portion 12 through the wiring patterns 82C (including the pads 82a which serve as external connection terminals) on the wiring board S2, the reinforced fixation members 90C on the pads 82b of the wiring patterns 82C, the pads 35 provided on the micro movable substrate S1 and joined to the reinforced fixation members 90C, the portions 32d of the second layer 32 of the frame 30 in the micro movable substrate S1, the conductive vias 34b, the portion 31a of the first layer 31, the connecting portion 43, the portion 21c of the first layer 21 of the frame 20, the conductive via 24c, the portion 22a of the second layer 22, the conductive vias 24a, the portion 21a of the first layer 21, the connecting portions 41, and the beam portion 13 of the oscillating portion 10. The reference potential is applied to the electrode portion 60 through the wiring patterns 82C (including the pads 82a which serve as external connection terminals) on the wiring board S2, the reinforced fixation members 90C on the pads 82b of the wiring patterns 82C, the pads 35 provided on the micro movable substrate S1 and joined to the reinforced fixation members 90C, the portions 32d of the second layer 32 of the frame 30 in the micro movable substrate S1, the conductive vias 34b, the portion 31a of the first layer 31, the connecting portion 43, and the portion 21c of the first layer 21 of the frame 20.

Figure 24:
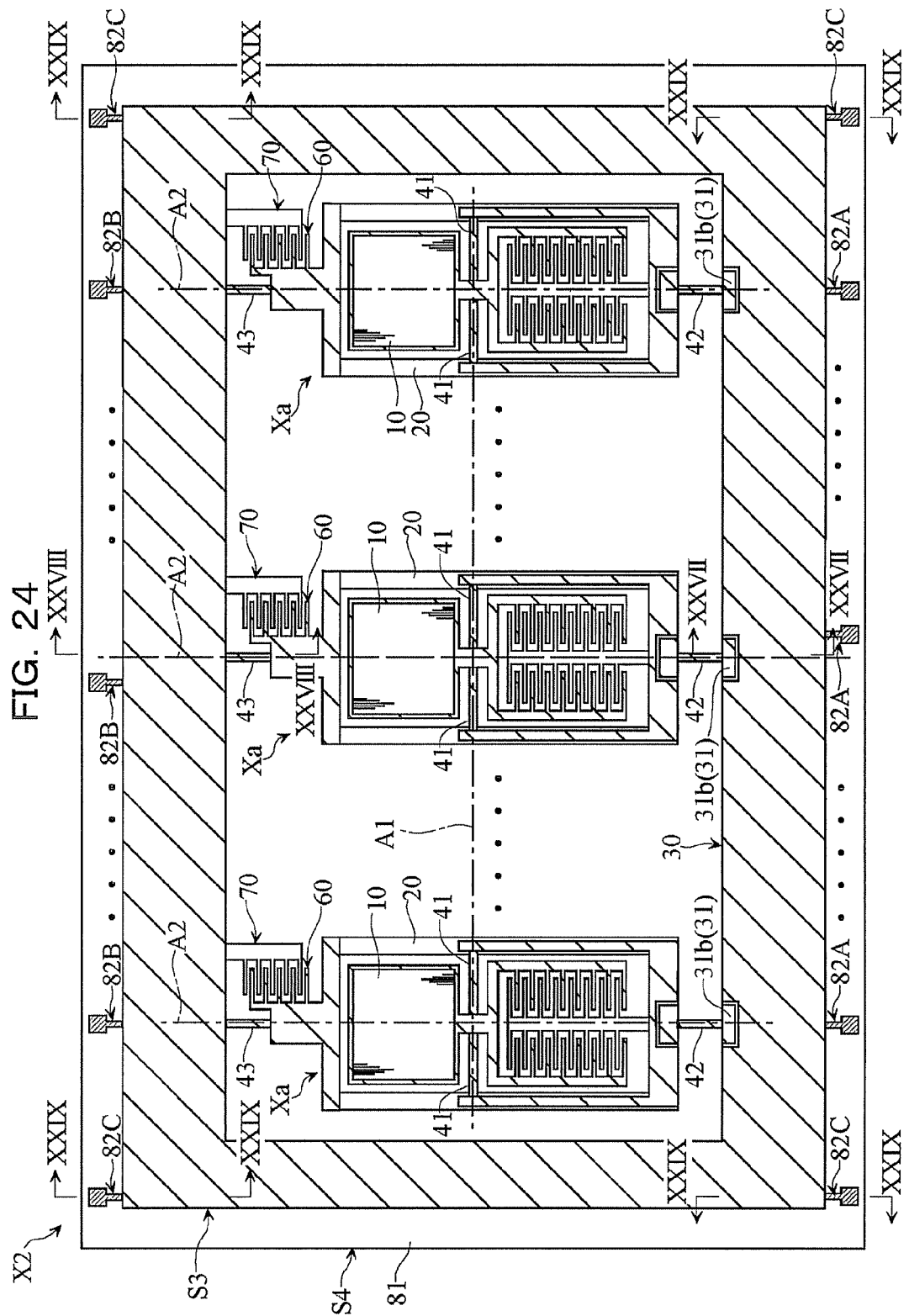
FIG. 24 is a plan view of a micro movable device according to a second embodiment.
Figure 25:
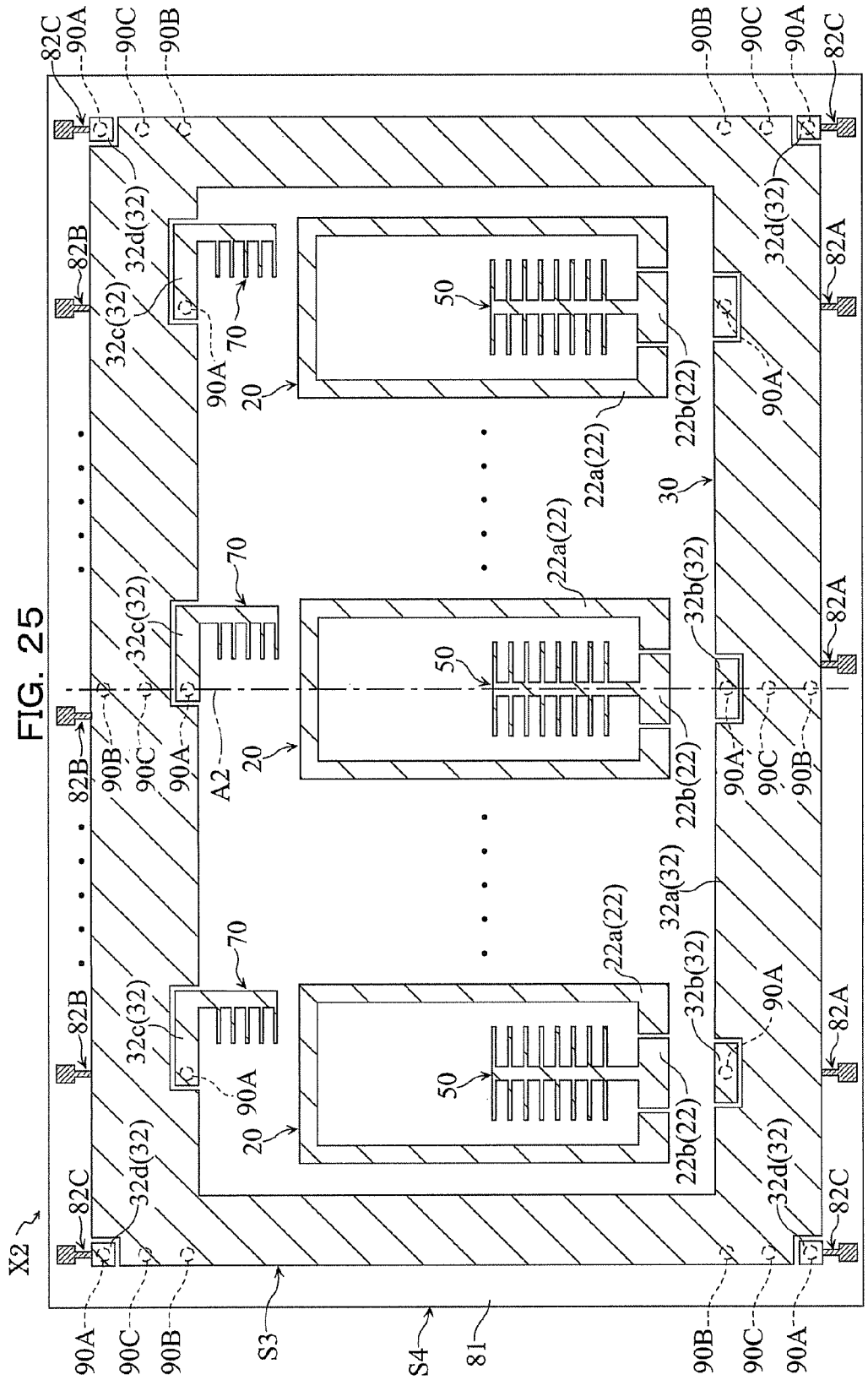
FIG. 25 is a plan view of a part of the micro movable device illustrated in FIG. 24.
Figure 26:
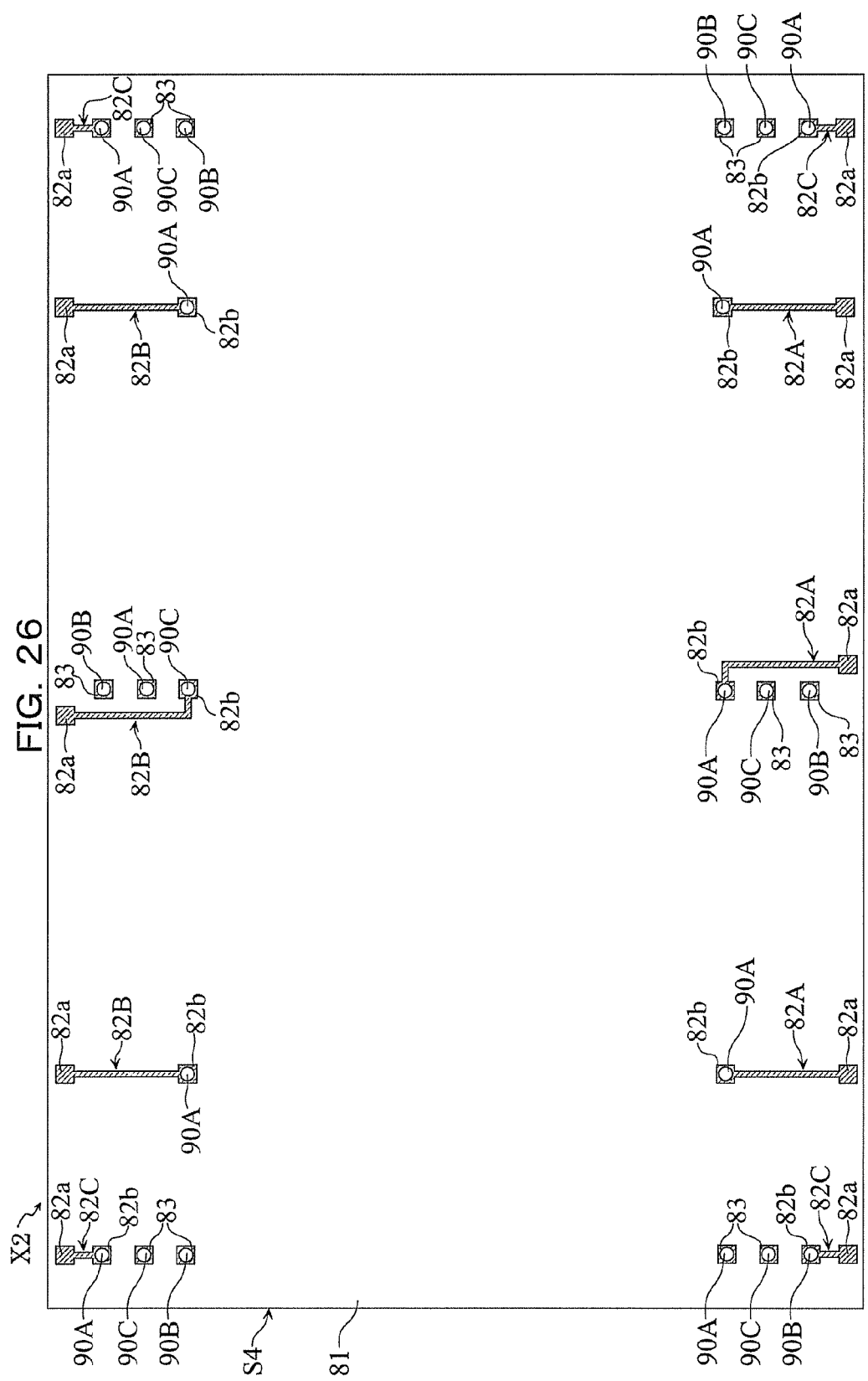
FIG. 26 is a plan view of another part of the micro movable device illustrated in FIG. 24.
Figure 27:
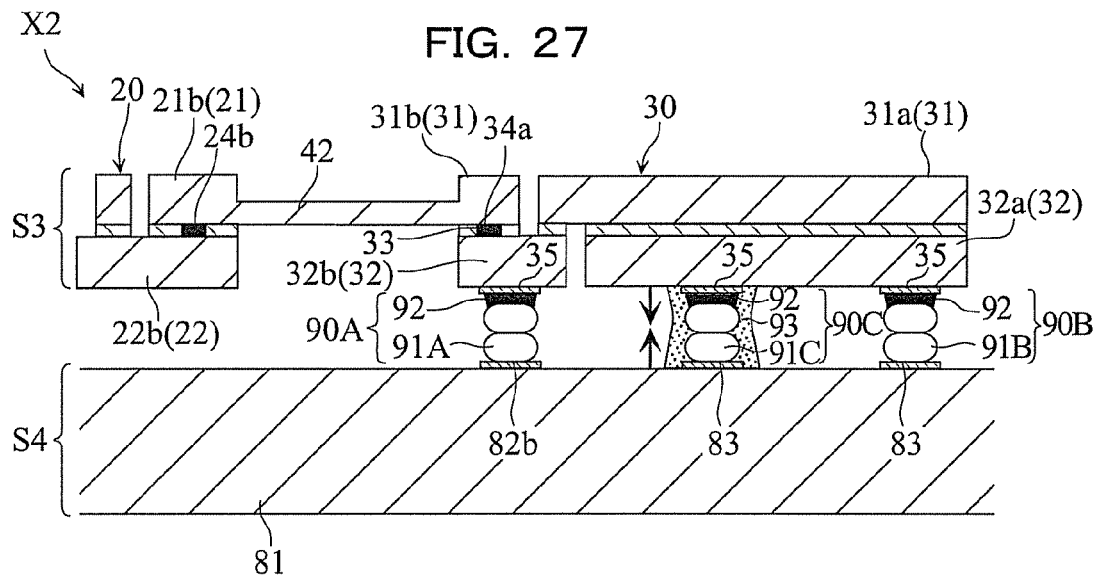
FIG. 27 is a sectional view of FIG. 24 taken along line XXVII-XXVII.
Figure 28:
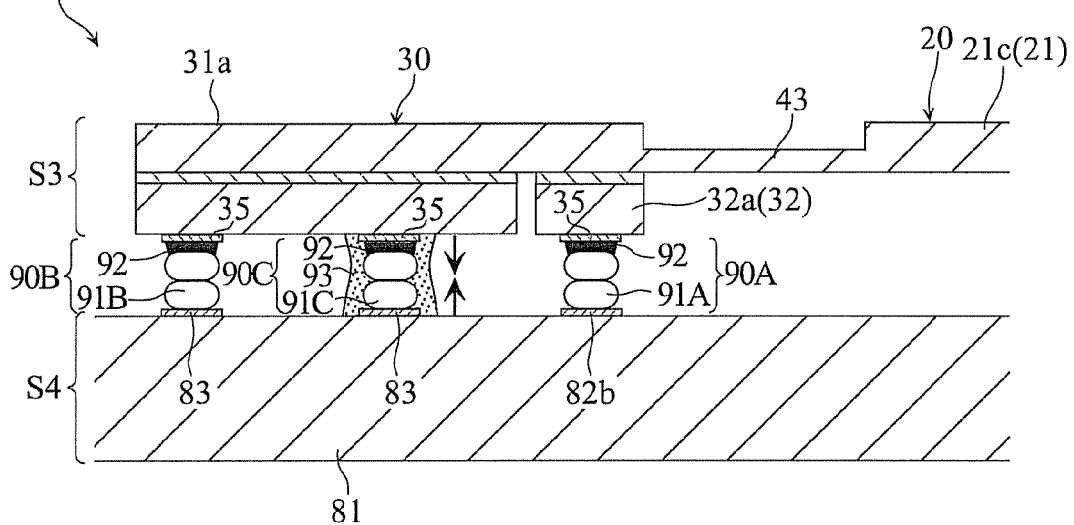
FIG. 28 is a sectional view of FIG. 24 taken along line XXVIII-XXVIII.
Figure 29:
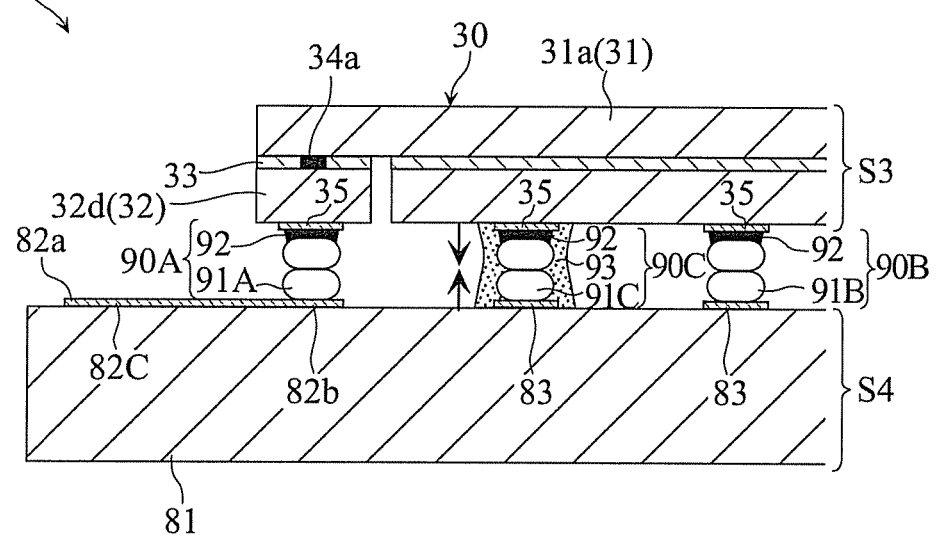
FIG. 29 is a sectional view of FIG. 24 taken along line XXIX-XXIX.

FIGS. 24 to 29 illustrate a micro movable device X2 according to a second embodiment. FIG. 24 is a plan view of the micro movable device X2. FIG. 25 is a plan view of a part of the micro movable device X2. FIG. 26 is a plan view of another part of the micro movable device X2. FIGS. 27 to 29 are sectional views of FIG. 24 taken along lines XXVII-XXVII, XXVIII-XXVIII, and XXIX-XXIX, respectively.

The micro movable device X2 includes a micro movable substrate S3, a wiring board S4, spacers 90A and 90B, and reinforced fixation portions 90C. According to the present embodiment, the micro movable device X2 may be used as a micromirror device.

The micro movable substrate S3 includes a plurality of micro movable units Xa having the structure similar to that of the above-described micro movable unit Xa. Each of the micro movable units Xa includes an oscillating portion 10, frames 20 and 30, a pair of connecting portions 41, a pair of connecting portions 42 and 43, and electrode portions 50, 60, and 70. The micro movable units Xa are arranged in a single row along the direction of the axial center A1 such that axial centers A2 of all of the micro movable units Xa are parallel to each other. Similar to the micro movable unit Xa according to the first embodiment, the micro movable units Xa according to the present embodiment are also formed by subjecting a material substrate to processes using bulk micromachining technology, such as the MEMS technology. An SOI wafer, for example, may be used as the material substrate. The material substrate includes a first silicon layer, a second silicon layer, and an insulating layer interposed between the first and second silicon layers. The silicon layers are doped with impurities to apply conductivity thereto. Each of the above-mentioned portions of the micro movable unit Xa is formed in the first silicon layer or the second silicon layer. To facilitate understanding of the drawings, portions formed in the first silicon layer are shaded in FIG. 24. In FIG. 25, portions formed in the second silicon layer are illustrated as provided on the wiring board S4. In other words, in FIG. 25, portions formed in the first silicon layer, portions formed on the first silicon layer, and portions formed in the insulating layer are omitted.

In the micro movable device X2, the micro movable units Xa have a common frame 30. A first layer 31 of the frame 30 has a portion 31a, as described in the first embodiment, which continuously extends around all of the micro movable units Xa. A second layer 32 of the frame 30 includes portions 32d which are common to all of the micro movable units Xa. The movable sections including the oscillating portions 10 and the frames 20 of all of the micro movable units Xa are surrounded by the common frame 30. In the micro movable substrate S3 in which the common frame 30 is formed, electrode portions 12 of the oscillating portions 10, portions 21a and 21c of first layers 21 in the frames 20, portions 22a of second layers 22 in the frames 20, the portions 32d of the second layer 32 of the frame 30, and the electrode portions 60 are electrically connected to each other in all of the micro movable units Xa.

As illustrated in FIG. 26, the wiring board S4 of the micro movable device X2 includes a base 81, wiring patterns 82A, 82B, and 82C, and pads 83. The base 81 is made of a silicon material. Each of the wiring patterns 82A, 82B, and 82C includes pads 82a and 82b. The pads 82a serve as external connection terminals of the micro movable device X2.

As illustrated in FIGS. 27 to 29, each of the spacers 90A included in the micro movable device X2 includes a bump unit 91A and an adhesive portion 92. The spacers 90A are disposed between the frame 30 in the micro movable substrate S3 and the wiring board S4. Each of the bump units 91A includes two bumps placed on top of each other. The bumps may be made of, for example, Au. The bump units 91A are pressed against the pads 82b in the wiring patterns 82A to 82C on the wiring board S4. In addition, the bump units 91A are joined to the pads 35 on the frame 30 in the micro movable substrate S3 by the adhesive portions 92. The adhesive portions 92 may be made of, for example, a conductive adhesive. The conductive adhesive contains a conductive filler. In the present embodiment, the spacers 90A electrically connect the micro movable substrate S3 and the wiring board S4 to each other.

As illustrated in FIGS. 27 to 29, each of the spacers 90B included in the micro movable device X2 includes a bump unit 91B and an adhesive portion 92. The spacers 90B are disposed between the frame 30 in the micro movable substrate S3 and the wiring board S4. Each of the bump units 91B includes two bumps placed on top of each other. The bumps may be made of, for example, Au. The bump units 91B are pressed against the pads 83 on the wiring board S4. In addition, the bump units 91B are joined to the pads 35 on the frame 30 in the micro movable substrate S3 by the adhesive portions 92. The adhesive portions 92 may be made of, for example, conductive adhesive.

As illustrated in FIGS. 27 to 29, each of the reinforced fixation members 90C of the micro movable device X2 includes a bump unit 91C and adhesive portions 92 and 93. The reinforced fixation members 90C are disposed between the frame 30 in the micro movable substrate S3 and the wiring board S4. Each of the bump units 91C includes two bumps placed on top of each other. The bumps may be made of, for example, Au. The bump units 91C are pressed against the pads 83 on the wiring board S4. The bump units 91C are joined to the pads 35 on the frame 30 in the micro movable substrate S3 by the adhesive portions 92. The adhesive portions 92 may be made of, for example, a conductive adhesive. The adhesive portions 93 are provided so as to cover the periphery of the bump units 91C and join the micro movable substrate S3 and the wiring board S4 to each other. The adhesive portions 93 may be made of, for example, a conductive adhesive. Since the reinforced fixation members 90C are provided, the micro movable substrate S3 and the wiring board S4 may be strongly fixed to each other.

As illustrated in FIGS. 27 to 29, each of the reinforced fixation members 90C of the micro movable device X2 is disposed between the corresponding pair of spacers 90A and 90B. The pairs of spacers 90A and 90B and the reinforced fixation portions 90C illustrated in FIGS. 27 to 29 are arranged in a line parallel to the axial centers A2 of the corresponding micro movable units Xa. The pair of spacers 90A and 90B and the reinforced fixation member 90C illustrated in FIG. 27 are joined to the frame 30 at positions in a line parallel to the axial center A2 of the corresponding micro movable unit Xa, as illustrated in FIG. 25. The pair of spacers 90A and 90B and the reinforced fixation member 90C illustrated in FIG. 28 are also joined to the frame 30 at positions in a line parallel to the axial center A2 of the corresponding micro movable unit Xa, as illustrated in FIG. 25.

When the micro movable device X2 is driven, the reference potential is commonly applied to the electrode portions 12 of the oscillating portions 10 and the electrode portions 60 of all of the micro movable units Xa. In this state, a drive potential is applied to the electrode portions 50 and 70 of selected micro movable units Xa. Thus, the oscillating portions 10 and the frames 20 of the micro movable units Xa are individually rotated, and the direction in which light is reflected by the mirror surfaces 11a provided on the land portions 11 of the respective micro movable units Xa may be changed individually. The reference potential is commonly applied to the electrode portions 12 of the oscillating portions 10 and the electrode portions 60 of all of the micro movable units Xa through the wiring patterns 82C (including the pads 82a which serve as external connection terminals) on the wiring board S4, the spacers 90A on the pads 82b of the wiring patterns 82C, the pads 35 provided on the micro movable substrate S3 and joined to the spacers 90A, the portions 32d of the second layer 32 of the frame 30 in the micro movable substrate S3, the conductive vias 34b, the portion 31a of the first layer 31, the connecting portions 43, the portions 21c of the first layers 21 of the frames 20, the conductive vias 24c, the portions 22a of the second layers 22, the conductive vias 24a, the portions 21a of the first layers 21, the connecting portions 41, and the beam portions 13 of the oscillating portions 10. The reference potential may be, for example, a ground potential and is preferably maintained constant. The drive potential is applied to the electrode portions 50 and 70 of the selected micro movable units Xa in a manner similar to the application of the drive voltage to the electrode portions 50 and 70 of the micro movable unit Xa according to the first embodiment.

In manufacturing the micro movable device X2, the micro movable substrate S3 illustrated in FIG. 30A is formed by a method similar to the method for forming the micro movable substrate S1 included in the micro movable device X1.

In addition, in the process of manufacturing the micro movable device X2, the bump units 91A to 91C, the conductive adhesive 92', and the reinforcing adhesive 93' are placed on the pads 82b and 83 on the wiring board S4, as illustrated in FIG. 30A, by a method similar to the method for placing the bump units 91A to 91C, the conductive adhesive 92', and the reinforcing adhesive 93' on the pads 82b and 83 on the wiring board S2 included in the micro movable device X1.

As illustrated in FIG. 30B, the micro movable substrate S3 and the wiring board S4 are joined to each other such that the bump units 91A to 91C, the conductive adhesive 92', and the reinforcing adhesive 93' are disposed therebetween. In this processing, the conductive adhesive 92' and the reinforcing adhesive 93' are cured by applying heat, thereby forming the adhesive portions 92 and 93.

Thus, the micro movable device X2 is manufactured which includes the micro movable substrate S3, the wiring board S4, and the spacers 90A and 90B and the reinforced fixation members 90C which are provided so as to join the micro movable substrate S3 and the wiring board S4 to each other.

In the process of joining the micro movable substrate S3 and the wiring board S4 to each other, a large amount of reinforcing adhesive 93' applied to the bump units 91C is cured. Thus, the adhesive portions 93 of the reinforced fixation members 90C are formed. The reinforcing adhesive 93' contracts when it is cured. Therefore, a stress is applied to the frame 30 in the micro movable substrate S3 at positions where the reinforced fixation members 90C are joined. For example, a tensile stress is applied in a direction such that the distance between the micro movable substrate S3 and the wiring board S4 decreases. However, as illustrated in FIGS. 27 to 29, each of the reinforced fixation members 90C including the adhesive portions 93 is disposed between the corresponding pair of spacers 90A and 90B. Therefore, the frame 30 may be prevented from being deformed by the above-described stress. The spacers 90A and 90B and the reinforced fixation members 90C resist the stress applied to the frame 30 at positions where the reinforced fixation members 90C are joined. Therefore, the boundary between the adhesive portion 93 of each reinforced fixation member 90C and the micro movable substrate S3 serves as a point of force and the boundary between each of the spacers 90A and 90B and the micro movable substrate S3 serves as a fulcrum, so that deformation of the frame 30 may be reduced if not prevented. As a result, in the micro movable device X2, spring constants of the connecting portions 42 and 43 after the processing of joining the micro movable substrate S3 and the wiring board S4 to each other may be prevented from being changed due to the joining process. Changes in the spring constants of the connecting portions 42 and 43, which are included in the micro movable units Xa and connected to the frame 30, are caused by the deformation of the frame 30.

In addition, in the manufactured micro movable device X2, the volume of the adhesive portion 93 of each reinforced fixation member 90C varies in accordance with the temperature variation. Therefore, a stress is applied to the frame 30 in the micro movable substrate S3 at positions where the reinforced fixation members 90C are joined. However, as illustrated in FIGS. 27 to 29, each of the reinforced fixation members 90C including the adhesive portions 93 is disposed between the corresponding pair of spacers 90A and 90B. Therefore, the frame 30 may be prevented from being deformed by the above-described stress. The spacers 90A and 90B and the reinforced fixation members 90C resist the stress applied to the frame 30 at positions where the reinforced fixation members 90C are joined. Therefore, the boundary between the adhesive portion 93 of each reinforced fixation member 90C and the micro movable substrate S3 serves as a point of force and the boundary between each of the spacers 90A and 90B and the micro movable substrate S3 serves as a fulcrum, so that deformation of the frame 30 may be prevented. As a result, in the micro movable device X2, spring constants of the connecting portions 42 and 43 in each micro movable unit Xa after the processing of joining the micro movable substrate S3 and the wiring board S4 to each other may be prevented from being changed due to the joining process.

As described above, the spring constants of the connecting portions 42 and 43, which connect the movable section (the oscillating portion 10, the frame 20, the connecting portions 41, the electrode portion 50, and the electrode portion 60) to the frame 30 in each micro movable unit Xa, after the process of manufacturing the micro movable device X2 may be prevented from being changed from the spring constants before the manufacturing process. In this type of micro movable device X2, mechanical characteristics, such as resonance frequency of the movable section, may be adequately controlled. Therefore, degradation of performance of the device may be suppressed.

In the micro movable device X2, the base material of the micro movable substrate S3 is a silicon material, as described above. The base 81, which is the base material of the wiring board S4, is also made of a silicon material, as described above. Therefore, a difference between a change in the volume of the micro movable substrate S3 and a change in the volume of the wiring board S4 (support base) due to temperature variation may be reduced. As a result, a stress applied to the frame 30 in the micro movable substrate S3 at positions where the reinforced fixation members 90C are joined may be reduced.

In the micro movable device X2, the pairs of spacers 90A and 90B and the reinforced fixation portions 90C illustrated in FIGS. 27 to 29 are arranged in a line parallel to the axial centers A2 of the corresponding micro movable units Xa. The pair of spacers 90A and 90B and the reinforced fixation member 90C illustrated in FIG. 27 are joined at positions in a line parallel to the axial center A2 of the corresponding micro movable unit Xa. The pair of spacers 90A and 90B and the reinforced fixation member 90C illustrated in FIG. 28 are also joined at positions in a line parallel to the axial center A2 of the corresponding micro movable unit Xa. Therefore, variation in the spring constants of the connecting portions 42 and 43 may be suppressed.

In the micro movable device X2, each of the reinforced fixation members 90C may include a plurality of bump units 91C, a plurality of adhesive portions 92 provided at the top of the respective bump units 91C, and an adhesive portion 93 provided so as to cover the periphery of the bump units 91C.

The shape of the pattern of the portions 32a to 32d of the second layer 32 of the frame 30 in the micro movable substrate S3, the shape of the wiring patterns 82A to 82C and the pattern of the pads 83 on the wiring board S4, and the arrangement of each set of the spacers 90A and 90B and the reinforced fixation member 90C, which are arranged in a single row, may be changed such that the micro movable substrate S3 and the wiring board S4 are electrically connected to each other by specific reinforced fixation members 90C. The micro movable substrate S3 and the wiring board S4 may be electrically connected to each other only by the reinforced fixation members 90C.

The above-described micro movable devices X1 and X2 may be used as components of an optical switching apparatus.

Figure 31:
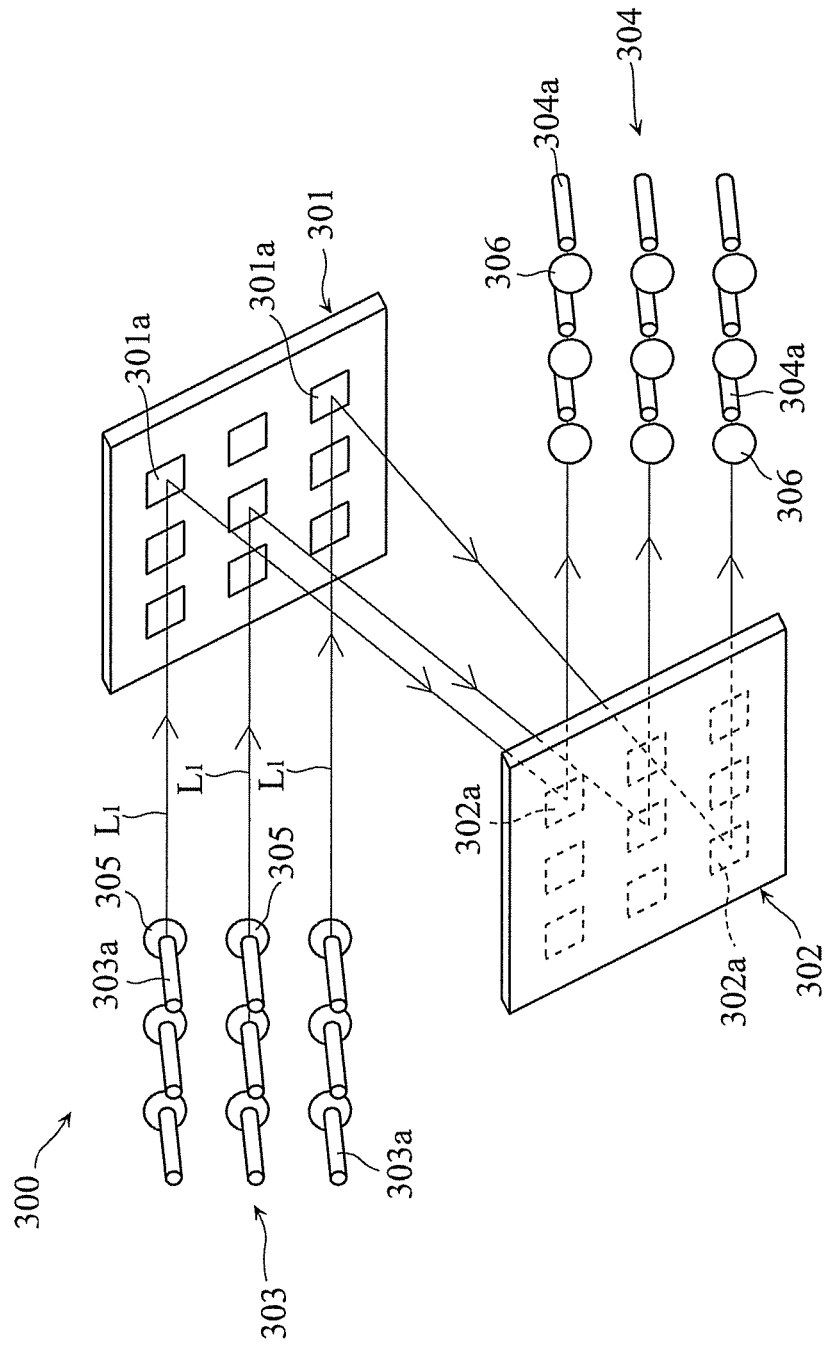
FIG. 31 is a schematic diagram illustrating an optical switching apparatus according to a third embodiment.

FIG. 31 is a schematic diagram illustrating an optical switching apparatus 300 of a spatial optical coupling type according to a third embodiment. The optical switching apparatus 300 includes a pair of micromirror arrays 301 and 302, an input fiber array 303, an output fiber array 304, and a plurality of microlenses 305 and 306. The input fiber array 303 includes a plurality of input fibers 303a. The micro mirror array 301 includes a plurality of micromirrors 301a which correspond to the input fibers 303a. The output fiber array 304 includes a plurality of output fibers 304a. The micro mirror array 302 includes a plurality of micromirrors 302a which correspond to the output fibers 304a. Each of the micromirrors 301a and 302a includes a mirror surface which reflects light. The orientations of the mirror surfaces of the micromirrors 301a and 302a are controllable. The above-described micro movable device X1 may be used as each of the micromirrors 301a and 302a. Alternatively, the above-described micro movable device X2 may be used as each of the micro mirror arrays 301 and 302. The microlenses 305 are disposed so as to face the input fibers 303a at ends thereof. The microlenses 306 are disposed so as to face the output fibers 304a at ends thereof.

In the optical switching apparatus 300, light beams L1 emitted from the input fibers 303a pass through the corresponding microlenses 305. Accordingly, the light beams L1 are converted into parallel beams and are guided to the micro mirror array 301. Then, the light beams L1 are reflected by the corresponding micromirrors 301a, and are deflected toward the micro mirror array 302. At this time, the mirror surfaces of the micromirrors 301a are oriented in specific directions so that the light beams L1 may be incident on the desired micromirrors 302a. Then, the light beams L1 are reflected by the micromirrors 302a and are deflected toward the output fiber array 304. At this time, the mirror surfaces of the micromirrors 302a are oriented in specific directions so that the light beams L1 may be incident on the desired output fibers 304a.

Thus, in the optical switching apparatus 300, the light beams L1 emitted from the respective input fibers 303a are deflected by the micro mirror arrays 301 and 302 and are caused to reach the desired output fibers 304a. In other words, the input fibers 303a and the output fibers 304a are connected to each other in one-to-one correspondence. In addition, by changing the deflecting angles of the micromirrors 301a and 302a, the output fibers 304a at which the light beams L1 arrive may be changed.

Characteristics of an optical switching apparatus which switches a transmission path of an optical signal, which is transmitted via an optical fiber, from a first fiber to a second fiber include transmission capacity, transmission speed, and reliability in the switching operation. From this point of view, a micromirror device formed by micromachining techniques is suitable for use as a switching device included in the optical switching apparatus. In the case where the micromirror device is used, a switching process of an optical signal between an input optical transmission path and an output optical transmission path may be performed by the optical switching apparatus without converting the optical signal into an electrical signal.

FIG. 32 is a schematic diagram illustrating an optical switching apparatus 400 of a wavelength selection type according to a fourth embodiment. The optical switching apparatus 400 includes a micromirror array 401, a single input fiber 402, three output fibers 403, a plurality of microlenses 404a and 404b, a spectral element 405, and a condensing lens 406. The micromirror array 401 includes a plurality of micromirrors 401a. The number of input fibers 402 is not limited to one. The number of output fibers 403 is not limited to three. The micromirrors 401a may be, for example, arranged along a single row in the micromirror array 401. Each of the micromirrors 401a includes a mirror surface which reflects light. The orientations of the mirror surfaces of the micromirrors 401a are controllable. The micro movable device X1 may be used as each of the micromirrors 401a. Alternatively, the micro movable device X2 may be used as the micromirror array 401. The microlens 404a is disposed so as to face the input fiber 402 at an end thereof. The microlenses 404b are disposed so as to face the output fibers 403 at ends thereof. The spectral element 405 is a reflective diffraction grating at which light is reflected at different degrees of reflection depending on the wavelength thereof.

In the optical switching apparatus 400, a light beam L2 including components of different wavelengths is emitted from the input fiber 402. The thus-emitted light beam L2 is collimated when the light beam L2 passes through the microlens 404a. The light beam L2 is reflected by the spectral element 405. At this time, the components of different wavelengths of the light beam L2 are reflected at different angles. The reflected light components pass through the condensing lens 406. Accordingly, the light components are collected at the corresponding micromirrors 401a in the micromirror array 401 in accordance with the wavelengths thereof. The light components having different wavelengths are reflected by the corresponding micromirrors 401a in specific directions. At this time, the mirror surfaces of the micromirrors 401a are oriented in specific directions so that the light components having the corresponding wavelengths may reach the desired output fibers 403. The light components reflected by the micromirrors 401a pass through the condensing lens 406, the spectral element 405, and the microlenses 404b, and are incident on the selected output fibers 403. Thus, the light components having the desired wavelengths may be selectively obtained from the light beam L2 by the optical switching apparatus 400.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions have been described in detail, it should be understood that the various changes, substitutions, and alterations could be made hereto without departing from the spirit and scope of the invention.

What is claimed is:

1. A micro movable device comprising:
    a micro movable substrate including a micro movable unit, the micro movable unit including a frame section, a movable section, and a coupling section which couples the frame section and the movable section to each other;
    a support base;
    a first spacer and a second spacer, each of which couples the frame section and the support base to each other; and
    a fixation member including
    a spacer portion which couples the frame section and the support base to each other, and
    an adhesive portion which covers all surfaces of the spacer portion not in contact with the frame section or the support base and which does not cover surfaces of the first spacer and the second spacer not in contact with one of the frame section and the support base,
    wherein the fixation member is provided between the first spacer and the second spacer, and wherein the first spacer and the second spacer are not covered by adhesive and resist stress on the frame section caused by the adhesive portion of the fixation member
    wherein the spacer portion of the fixation member includes multiple discrete segments extending between the micro movable substrate and the support base, and
    wherein the adhesive portion of the fixation member does not extend from one of the discrete segments to another of the discrete segments.

2. The micro movable device according to claim 1, wherein the coupling section defines an axial center of rotation of the movable section,
    wherein the first spacer, the fixation member and the second spacer are arranged on the support base in a line parallel to the axial center.

3. The micro movable device according to claim 2, wherein the first spacer, the fixation member and the second spacer are coupled to the frame section in a line parallel to the axial center.

4. The micro movable device according to claim 2, wherein the first spacer, the fixation member, and the second spacer are arranged in this order from an edge of the support base, the edge being perpendicular to the axial center.

5. The micro movable device according to claim 1,
    wherein the support base is a wiring board, and
    wherein at least one of the spacers or the spacer portion electrically connects the wiring board and the micro movable substrate to each other.

6. The micro movable device according to claim 5, wherein the at least one of the spacers or the spacer portion which electrically connects the wiring board and the micro movable substrate to each other includes a bump unit including at least one Au bump.

7. The micro movable device according to claim 6, wherein the bump unit is joined to the micro movable substrate with a conductive adhesive.

8. The micro movable device according to claim 1, wherein a base material of the micro movable substrate and a base material of the support base are silicon material.

9. The micro movable device according to claim 1, wherein the micro movable unit further includes a drive mechanism configured to rotate the movable section.

10. The micro movable device according to claim 1, wherein the movable section includes a movable frame portion, a movable body, and a coupling portion which couples the movable frame portion and the movable body to each other.

11. The micro movable device according to claim 1, wherein the adhesive portion of the fixation member directly connects the frame section and the support base to each other.

12. The micro movable device according to claim 1, wherein the adhesive portion of the fixation member does not coat any surface of the spacer portion in contact with the frame section or the support base.

13. The micro movable device according to claim 1, wherein each of the first spacer, the spacer portion, and the second spacer includes stacked two bumps.

14. A micro movable device comprising:
    a micro movable substrate including a plurality of micro movable units, each micro movable unit including a frame section, a movable section, and a coupling section which couples the frame section and the movable section to each other, the frame sections of the micro movable units being integrated with each other to form a common frame;
    a support base;
    a first spacer and a second spacer, each of which couples the common frame and the support base to each other; and
    a fixation member including
    a spacer portion which joins the common frame and the support base to each other, and
    an adhesive portion which covers all surfaces of the spacer portion not in contact with the common frame or the support base and which does not cover surfaces of the first spacer and the second spacer not in contact with one of the frame section and the support base,
    wherein the fixation member is provided between the first spacer and the second spacer, and wherein the first spacer and the second spacer are not covered by adhesive and resist stress on the frame section caused by the adhesive portion of the fixation member
    wherein the spacer portion of the fixation member includes multiple discrete segments extending between the micro movable substrate and the support base, and
    wherein the adhesive portion of the fixation member does not extend from one of the discrete segments to another of the discrete segments.

15. The micro movable device according to claim 14, wherein, in at least one of the micro movable units, the coupling section defines an axial center of rotation of the movable section, and wherein the first spacer, the fixation member and the second spacer are arranged in a line parallel to the axial center on the support base.

16. The micro movable device according to claim 15, wherein the first spacer, the fixation member and the second spacer are coupled to the common frame in a line parallel to the axial center.

17. The micro movable device according to claim 14, wherein, in each of the micro movable units, the coupling section defines an axial center of rotation of the movable section, and
wherein the micro movable units are arranged parallel to each other such that the axial centers of the micro movable units are parallel to each other.

18. The micro movable device according to claim 14, wherein the adhesive portion of the fixation member directly connects the common frame and the support base to each other.

19. An optical switching apparatus comprising:
a micromirror array including a plurality of micromirror devices, wherein each of the micromirror devices includes
a micro movable substrate including a micro movable unit, the micro movable unit including a frame section, a movable section, and a coupling section which couples the frame section and the movable section to each other,
a mirror portion provided on the movable section,
a support base,
a first spacer and a second spacer, each of which couples the frame section and the support base to each other, and
a fixation member including
a spacer portion which joins the frame section and the support base to each other, and
an adhesive portion which covers all surfaces of the spacer portion not in contact with the frame section or the support base and which does not cover surfaces of the first spacer and the second spacer not in contact with one of the frame section and the support base,
wherein the fixation member is provided between the first spacer and the second spacer, and wherein the first spacer and the second spacer are not covered by adhesive and resist stress on the frame section caused by the adhesive portion of the fixation member
wherein the spacer portion of the fixation member includes multiple discrete segments extending between the micro movable substrate and the support base, and
wherein the adhesive portion of the fixation member does not extend from one of the discrete segments to another of the discrete segments.

\* \* \* \* \*